(12) United States Patent
Ohtake et al.

(10) Patent No.: US 6,972,453 B2
(45) Date of Patent: Dec. 6, 2005

(54) METHOD OF MANUFACTURING A SEMICONDUCTOR DEVICE CAPABLE OF ETCHING A MULTI-LAYER OF ORGANIC FILMS AT A HIGH SELECTIVITY

(75) Inventors: Hiroto Ohtake, Tokyo (JP); Shinobu Saitoh, Tokyo (JP); Munehiro Tada, Tokyo (JP); Yoshihiro Hayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 285 days.

(21) Appl. No.: 10/080,848

(22) Filed: Feb. 22, 2002

(65) Prior Publication Data

US 2002/0155639 A1 Oct. 24, 2002

(51) Int. Cl.$^7$ ................................................. H01L 29/76
(52) U.S. Cl. ....................... 257/314; 257/315; 257/316; 257/758; 438/620
(58) Field of Search .................................. 257/314–316, 257/758–760; 438/620–634, 637–641, 692, 759, 762

(56) References Cited

U.S. PATENT DOCUMENTS 6,207,576 B1 * 3/2001 Wang et al. ................. 438/706
6,235,628 B1 * 5/2001 Wang et al. ................. 438/638
6,265,780 B1 * 7/2001 Yew et al. ................... 257/759
6,284,149 B1 * 9/2001 Li et al. ........................ 216/64
6,383,931 B1 * 5/2002 Flanner et al. .............. 438/689
6,395,632 B1 * 5/2002 Farrar ......................... 438/687
6,417,112 B1 * 7/2002 Peyne et al. ................. 438/754
6,638,848 B1   10/2003 Fukasawa et al.
2003/0162407 A1 * 8/2003 Maex et al. ................. 438/725

FOREIGN PATENT DOCUMENTS

| JP | H10-268526 | 10/1998 |
|----|------------|---------|
| JP | 2000-252359 | 9/2000 |
| JP | 2000-76754 | 12/2000 |

\* cited by examiner

Primary Examiner—Duy-Vu N. Deo

(74) Attorney, Agent, or Firm—Choate, Hall & Stewart LLP

(57) ABSTRACT

In a method of manufacturing a semiconductor device, with respect to a stacked film including a silicon included organic film and a silicon non-included organic film, the silicon non-included organic film is etched by using the etching gas of mixed N2 gas and H2 gas.

15 Claims, 25 Drawing Sheets

METHOD OF MANUFACTURING A SEMICONDUCTOR DEVICE CAPABLE OF ETCHING A MULTI-LAYER OF ORGANIC FILMS AT A HIGH SELECTIVITY

BACKGROUND OF THE INVENTION

The present invention relates to a method of manufacturing a semiconductor device, in particular to a method of manufacturing a semiconductor device including an organic film.

An ULSI (Ultra Large Scale Integration) device in recent years requires that not fewer than several billions semiconductor elements are integrated in a chip of several millimeters×several millimeters. It is therefore necessary that a semiconductor element is miniature and has a multi-layer structure. Particularly, in order to accelerate high-speed operation of a semiconductor device, such as the ULSI device, it is an important object to reduce wiring resistance as well as interlayer capacitance.

In order to reduce wiring resistance, a proposal is made about a method of using a copper as a wiring material. This copper wiring not only has a low resistance but also is highly reliable. The copper wiring is therefore the most remarkable as a wiring material of a next generation. However, it is difficult to process copper by dry etching, different from a conventional aluminum material. Accordingly, a buried-wiring technique using CMP (Chemical Mechanical Polishing) has been conducted to form the copper wiring.

FIGS. 19, 20 and 21 show a typical buried wiring technique of copper, respectively. At first, as illustrated in FIG. 19(a), a MOS (Metal Oxide Semiconductor) transistor 1 is formed on an upper surface of a semiconductor wafer 1a, such as a silicon substrate. Namely, source/drain 1b, a gate 1c and a sidewall 1d of which the MOS transistor 1 is composed are formed on the upper surface of the semiconductor wafer 1a.

Next, as illustrated in FIG. 19(b), an interlayer insulating film, such as a silicon oxide film 2 is formed thereon, so that the MOS transistor 1 is overlaid by the interlayer insulating film. Further, as illustrated in FIG. 19(c), a plug 3 which is connected to the source/drain 1b of the MOS transistor 1 is formed through the interlayer insulating film. The plug 3 is formed by the use of a conductive plug, such as a tungsten plug.

Thereafter, as illustrated in FIG. 20(a), a silicon nitride film 4 is formed on the silicon oxide film 2 and the plug 3 by the use of CVD (Chemical Vapor Deposition) method. Further a silicon oxide film 5 is formed, as an interlayer insulating film, on an upper surface of the silicon nitride film 4. The silicon nitride film 4 functions as an etching stopper, when the silicon oxide film 5 is etched.

Next, as illustrated in FIG. 20(b), a photo resist 6 is formed on an upper surface of the silicon oxide film 5. In the photo resist 6, an opened trench 6a is formed by the use of photolithography technique. Further, as illustrated in FIG. 20(c), the silicon oxide film 5 is etched using the photo resist 6 as an etching mask. Furthermore, the photo resist 6 is removed from the upper surface of the silicon oxide film 5 by the use of oxygen plasma.

Moreover, as illustrated in FIG. 21(a), the silicon nitride film 4 is etched using the silicon oxide film 5 as an etching mask to form a contact 7 with the lower layers. Thereafter, a copper is buried in the contact 7 by plating and polished by the use of the CMP method. As a result, a copper wiring 8 is formed as illustrated in FIG. 21(b).

As the other buried wiring technique of copper, a proposal is made as regards a method of using an organic film of low dielectric constant as the interlayer insulating film (FIGS. 22, 23 and 24). In the buried wiring technique of copper, the organic film of low dielectric constant is used as the interlayer insulating film, so that the interlayer capacitance is reduced.

In the buried wiring technique of copper, at first, as illustrated in FIG. 22(a), source/drain 11b, a gate 11c and a side wall 11d are formed on an upper surface of a semiconductor wafer 11a, such as a silicon substrate. A MOS transistor 11 is composed of the source/drain 11b, the gate 11c and the sidewall 11d. Thereafter, as illustrated in FIG. 22(b), a silicon oxide film 12 is formed thereon as an interlayer insulating film, so that the MOS transistor 11 is overlaid by the silicon oxide film 12.

Further, as illustrated in FIG. 22(c), a plug 13 which is connected to the MOS transistor 11 is formed through the interlayer insulating film. The plug 13 is formed by the use of a conductive plug, such as a tungsten plug. Further, a silicon nitride film 14 is formed on the silicon oxide film 12 and the plug 13 so that the silicon oxide film 12 and the plug 13 are overlaid by the silicon nitride film 14. Further, by the use of spin coating method, an organic film 15 is formed, as an interlayer insulating film, on an upper surface of the silicon nitride film 14. The organic film 15 is formed by an organic material of low dielectric constant, such as polyallyl-ether. The silicon nitride film 14 functions as an etching stopper, when the organic film 15 is etched.

Further, as illustrated in FIG. 23(a), a silicon nitride film 16 and a silicon oxide film 17 are formed one by one as stacked inorganic mask films. As a result, a structure illustrated in FIG. 23(a) is formed, namely, the organic film 15 of low dielectric constant is interposed between the silicon nitride films 14 and 16 both having high dielectric constant.

Next, as illustrated in FIG. 23(b), a photo resist 18 is formed on an upper surface of the silicon oxide film 17. In the photo resist 18, an opened trench 18a is formed by the use of photolithography technique. Further, as illustrated in FIG. 23(c), the silicon oxide film 17 is etched using the photo resist 18 as an etching mask to form an opening portion 17a. Furthermore, the photo resist 18 is removed from the upper surface of the silicon oxide film 17 by the use of oxygen plasma.

The above-mentioned silicon nitride film 16 is formed to protect the organic film 15 from the oxygen plasma for removing the photo resist 18. Namely, when the photo resist 18 is removed from the upper surface of the silicon oxide film 17, the silicon nitride film 16 exists under the opening portion 17a formed in the silicon oxide film 17. Consequently, the organic film 15 is never exposed to the oxygen plasma to be etched Besides, remove of the photo resist 18 can be carried out also by hydrogen plasma. In this case, the organic film 15 would be etched, if the organic film 15 is directly exposed to the hydrogen plasma. Accordingly, the silicon nitride film 16 having high dielectric constant is formed on an upper surface of the organic film 15, even if the remove of the photo resist 18 is carried out by the hydrogen plasma.

Thereafter, as illustrated in FIG. 24(a), the silicon nitride film 16 is etched using the silicon oxide film 17 thus patterned as a hard etching mask. Further, the organic film 15 is etched by the use of plasma gas of $N_2O_2$, as illustrated in FIG. 24(b). The silicon nitride film 14 functions as an etching stopper, when the organic film 15 is etched.

Further, the silicon nitride film 14, that is, the etching stopper is etched to form a contact hole 19a connected to the plug 13. Ta/TaN film is then formed in the contact hole 19a, as illustrated in FIG. 24(c). A copper film is buried into the contact hole 19a by a plating method. Further, Ta/TaN film and a copper film laid on the outside portions of the contact hole 19a is removed therefrom by the CMP method. As a result, a copper wiring 19 buried in the organic film 15 is formed.

Further, after forming the copper wiring 19, a cap film 20 is sometimes formed so that the copper wiring 19 and the silicon oxide film 17 may be overlaid by the cap film 20, as illustrated in FIG. 25. The cap film 20 functions to prevent copper contained in the copper wiring 19 from being diffused. At the same time, the cap film 20 functions as a stopper film, when another wiring is formed above the copper wiring 19. An inorganic film having high dielectric constant, such as a silicon nitride film, a silicon carbide film (SiC), or a silicon carbide and nitride film (SiCN) is used as the cap film 20.

Thus mentioned, in the well-known busied wiring technique of copper, the organic film 15 of low dielectric constant is introduced as an interlayer insulating film for the purpose of reducing the interlayer capacitance of multi-layer wirings of ULSI.

However, in the well-known buried wiring technique of copper, the organic film 15 of low dielectric constant is covered by the silicon nitride film 16 having high dielectric constant This is because the organic film 15 tends to be etched by the oxygen plasma and the hydrogen plasma both used for removing the photo resist 18. Namely, a surface of the organic film 15 is covered by an inorganic insulating film, such as the silicon nitride film 16 having high dielectric constant, and the like in order to avoid etching of the organic film 15 during an oxygen plasma ashing for removing the photo resist 18. Further, in the well known buried wiring technique of copper, the silicon nitride film 14 having high dielectric constant is formed under the organic film 15 as the etching stopper.

However, since the organic film 15 is interposed between the silicon nitride films 14 and 16 both having high dielectric constant, an effective interlayer capacitance is unfavorably increased.

Further, in the well-known buried wiring technique of copper, the inorganic film having high dielectric constant, such as a silicon nitride film, a silicon carbide film (SiC), or a silicon carbide and nitride film (SiCN) is used also as the cap film 20. This is also unfavorable, because the effective interlayer capacitance is similarly increased.

Such problems can be solved by providing a technique for etching a multi-layer of organic films at a high selectivity. It is therefore desired that the technique for etching a multi-layer of organic films at a high selectivity is provided. It is particularly desired that a semiconductor device with a reduced interlayer capacitance is manufactured by using the technique for etching a multi-layer of organic films at a high selectivity.

Further, in a case that the technique for etching a multi-layer of organic films at a high selectivity is provided, freedom of designing manufacturing processes of a semiconductor device is enlarged. For example, let the technique for etching a multi-layer of organic films at a high selectivity be provided. Accordingly, it becomes possible to freely select an order of conducting an etching process and film forming process both contained in the manufacturing processes of a semiconductor device, dependent on whether via holes or buried wiring trenches contained in a semiconductor device are previously formed.

It is therefore desired that freedom of designing manufacturing processes of a semiconductor device is improved by using the technique for etching a multi-layer of organic films at a high selectivity.

SUMMARY OF THE INVENTION

It is therefore an object of the present invention to provide the technique for etching a multi-layer of organic films at a high selectivity.

It is another object of the present invention to manufacture a semiconductor device with a reduced interlayer capacitance by using the technique for etching a multi-layer of organic films at a high selectivity.

It is yet another object of the present invention to improve the freedom of designing manufacturing processes of a semiconductor device by using the technique for etching a multi-layer of organic films at a high selectivity.

According to an aspect of the present invention, there is provided a method of manufacturing a semiconductor device having a composite film composed of a silicon included organic film (34, 44, 46, 54, 56, 62, 64, 73, 82, 84, 86, 103, 105) and an organic film (35, 45, 55, 63, 72, 83, 85, 109), said method comprising the steps of: preparing gas plasma of mixture nitrogen and hydrogen; and etching said organic film (35, 45, 55, 63, 72, 83, 85, 109) by the use of said gas plasma.

The organic film (35, 45, 55, 63, 72, 83, 85, 109) is readily etched by the gas plasma of mixture nitrogen and hydrogen. On the contrary, the silicon included organic film (34, 44, 46, 54, 56, 62, 64, 73, 82, 84, 86, 103, 105) is hardly etched by the gas plasma of mixture nitrogen and hydrogen. Accordingly, when the organic film (35, 45, 55, 63, 72, 83, 85, 109) is etched, the organic film (35, 45, 55, 63, 72, 83, 85, 109) can be etched at a high selectivity against the silicon included organic film (34, 44, 46, 54, 56, 62, 64, 73, 82, 84, 86, 103, 105).

Further, in the method of manufacturing a semiconductor device, the organic film (35, 45, 55, 63, 83, 85) may be formed on said silicon included organic film (34, 44, 54, 62, 82, 84), in addition, an opening portion (35a, 45a, 55a, 69b, 91a, 91b) may be formed in said organic film (35, 45, 55, 63, 83, 85) by the use of said gas plasma with said silicon included organic film (34, 44, 54, 62, 82, 84) functioning as an etching stopper. In this method, the etching for forming the opening portion (35a 45a, 55a, 69b, 91a, 91b) in said organic film (35, 45, 55, 63, 83, 85) by the use of said gas plasma can be stopped by the silicon included organic film (34, 44, 54, 62, 82, 84).

Further, in the method of manufacturing a semiconductor device, said silicon included organic film (46, 56, 64, 86) may be formed on said organic film (45, 55, 63, 85), in addition, an opening portion (45a, 55a, 69a, 91b) maybe formed in said organic film (45, 55, 63, 85) by the use of said gas plasma with said silicon included organic film (46, 56, 64, 86) functioning as an mask. In this method, when the organic film (45, 55, 63, 85) is etched to form the opening portion (45a, 55a, 69a, 91b), the silicon included organic film (46, 56, 64, 86) is hardly etched by the gas plasma. The silicon included organic film (46, 56, 64, 86) can therefore function as an etching mask.

Further, in the method of manufacturing a semiconductor device, said silicon included organic film may include first and second silicon included organic films, said organic film (45, 55, 63, 85) may be formed on said first silicon included organic film (44, 54, 62, 84), said second silicon included organic film (46, 56, 64, 86) may be formed on said organic film (45, 55, 63, 85), an opening portion (45a, 55a, 69a, 91b) may be formed in said organic film (45, 55, 63, 85) by the use of said gas plasma not only with said second silicon included organic film (46, 56, 64, 86) functioning as an mask but also with said first silicon included organic film (44, 54, 62, 84) functioning as an etching stopper. In this method, the etching for forming the opening portion (45a, 55a, 69a, 91b) in said organic film (45, 55, 63, 85) by the use of said gas plasma can be stopped by the first silicon included organic film (44, 54, 62, 84). At the same time, since the second silicon included organic film (46, 56, 64, 86) is hardly etched by the gas plasma, the second silicon included organic film (46, 56, 64, 86) can function as an etching mask.

Further, the method of manufacturing a semiconductor device may comprise the steps of: forming said silicon included organic film (46, 64, 86) and an inorganic insulating film (47, 65, 87) on said organic film (45, 63, 85), forming an opening portion (47a, 65a, 87a) penetrating said inorganic insulating film (47, 65, 87) down to said silicon included organic film (46, 64, 86) by using a photo resist organic film pattern (48, 66, 88); selectively removing said photo resist organic film pattern (48, 66, 88) by the use of gas plasma of mixture nitrogen and hydrogen; and etching said silicon included organic film (46, 64, 86) and said organic film (45, 63, 85) with said opening portion (47a, 65a, 87a) formed in said inorganic insulating film (47, 65, 87) functioning as an mask.

Further, in the method of manufacturing a semiconductor device, an organic film (109) existing on a surface of stacked films comprising a silicon included insulating film (103, 105) and an inorganic insulating film (104. 106), said organic film (109) also existing within an opening portion (103a) formed in said stacked films, said organic film (109) may be removed therefrom by the use of gas plasma of mixture nitrogen and hydrogen. In this method, when the organic film (109) is removed, the silicon included insulating film (103, 105) is hardly etched by the gas plasma. Therefore, a sufficient over etching can be conducted, when the organic film (109) is removed.

Further, in the method of manufacturing a semiconductor device, said silicon included organic film (34. 44, 46, 54, 56, 62, 64, 73, 82, 84, 86, 103, 105) may be composed of a polymer of divinyl-siloxane-benzocyclobutene.

According to another aspect of the present invention, there is also provided a method of manufacturing a semiconductor device, said method comprising the steps of: (a) forming a silicon included organic film (34, 44, 46, 54, 56, 62, 64, 73, 82, 84, 86, 103, 105) composed of an organic compound including silicon; (b) forming a silicon non-included organic film (35, 45, 55, 63, 72, 83, 85, 109) composed of an organic compound including no silicon to be connected with said silicon included organic film (34, 44, 46, 54, 56, 62, 64, 73, 82, 84, 86, 103, 105); and (c) etching said silicon non-included organic film (35, 45, 55, 63, 72, 83, 85, 109) by the use of an etching gas including nitrogen and hydrogen.

The silicon non-included organic film (35, 45, 55, 63, 72, 83, 85, 109) is readily etched by the gas plasma of mixture nitrogen and hydrogen. On the contrary, the silicon included organic film (34, 44, 46, 54, 56, 62, 64, 73, 82, 84, 86, 103, 105) is hardly etched by the gas plasma of mixture nitrogen and hydrogen. Accordingly, when the silicon non-included organic film (35, 45, 55, 63, 72, 83, 85, 109) is etched, the silicon non-included organic film (35, 45, 55, 63, 72, 83, 85, 109) can be etched at a high selectivity against the silicon included organic film (34, 44, 46, 54. 56, 62, 64, 73, 82, 84, 86, 103, 105).

Further, in the method of manufacturing a semiconductor device, the method may comprise the steps of: (d) forming a silicon included organic film (34, 44, 54, 62, 82, 84) composed of a first organic compound including silicon on an upper side of a substrate (30–33, 40–43, 50–53, 61, 71, 82, 101); (e) forming a silicon non-included organic film (35, 45, 55, 63, 83, 85) composed of a second organic compound including substantially no silicon on an upper side of said silicon included organic film (34, 44, 54, 62, 82, 84); and (f) etching said silicon non-included organic film (35, 45, 55, 63, 83, 85) by the use of an etching gas including nitrogen and hydrogen to expose said silicon included organic film (34, 44, 54, 62, 82, 84). In this method, the etching of the silicon non-included organic film (35, 45, 55, 63, 83, 85) by the use of said etching gas can be stopped by the upper side of said silicon included organic film (34, 44, 54, 62, 82, 84).

In the method of manufacturing a semiconductor device, the method may further comprise the steps of: (g) forming another silicon included organic film (46, 56, 64, 86) composed of an organic compound including silicon on an upper side of said silicon non-included organic film (45, 55, 63, 85); (h) forming an opening portion in said another silicon included organic film (46, 56, 64, 86); and said (f) step including: (i) etching said silicon non-included organic film (45, 55, 63, 85) from said opening portion of said another silicon included organic film by the use of an etching gas including nitrogen and hydrogen to expose a part of a surface of said silicon included organic film (44, 54, 62, 82, 84). In this method, the etching of the silicon non-included organic film (45, 55, 63, 85) by the use of said etching gas can be stopped by the silicon included organic film (44, 54, 62, 82, 84). At the same time, since the another silicon included organic film (46, 56, 64, 86) is hardly etched, the another silicon included organic film (46, 56, 64, 86) can function as an etching mask.

Herein, the method of manufacturing a semiconductor device may further comprise the step of: (j) etching said silicon included organic film (54) and said another silicon included organic film (56) at the same time from an upper side of said another silicon included organic film (56) to form another opening portion penetrating said silicon included organic film (54) from said a part of a surface of said silicon included organic film (54) down to said substrate (50–53); and preferably, said another silicon included organic film (56) may be larger than said silicon included organic film (54) in thickness.

According to yet another aspect of the present invention, there is also provided a method of manufacturing a semiconductor device, said method comprising the steps of: (k) forming a silicon non-included organic film (45, 55, 63, 85) composed of a first organic compound including substantially no silicon on an upper side of a substrate (40–44, 50–54, 61, 62, 81–84); (l) forming a silicon included organic film (46, 56, 64, 86) composed of a second organic compound including silicon on an upper side of said silicon non-included organic film (45, 55, 63, 85); (m) forming an opening portion in said silicon included organic film (46, 56, 64, 86); and (n) etching said silicon non-included organic film (45, 55, 63, 85) from said opening portion of said silicon included organic film by the use of an etching gas including nitrogen and hydrogen to expose a substrate (40–44, 50–54, 61, 62, 81–84).

Further, the method of manufacturing a semiconductor device comprising the steps of: (o) forming a silicon included organic film (103, 105) composed of a first organic compound including silicon; (p) forming an opening portion (103a) in said silicon included organic film (103, 105); (q) forming a silicon non-included organic film (109) composed of a second organic compound including substantially no silicon within said opening portion (103a); and (r) removing said silicon non-included organic film (109) by the use of an etching gas including nitrogen and hydrogen. In this method, when the silicon non-included organic film (109) is removed, the silicon included insulating film (103, 105) is hardly etched by the etching gas including nitrogen and hydrogen. Therefore, a sufficient over etching can be conducted, when the silicon non-included organic film (109) is removed.

In the method of manufacturing a semiconductor device, it is desirable that the etching gas includes substantially no oxygen. This is because the silicon included organic film (34, 44, 46, 54, 56, 62, 64, 73, 82, 84, 86, 103, 105) is unfavorably etched, in a case that the etching gas included oxygen.

Further, in the method of manufacturing a semiconductor device, preferably, said first organic compound may include a polymer of a compound having the following structural formula;

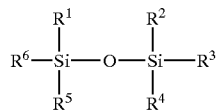

wherein R1 through R6: hydrocarbon radical

Furthermore, in the method of manufacturing a semiconductor device, preferably, said first organic compound may include a polymer of divinyl-siloxane-benzocyclobutene.

Moreover, in the method of manufacturing a semiconductor device, preferably, said first organic compound may include a polymer of siloxane-polyimide.

In addition, in the method of manufacturing a semiconductor device, preferably, said first organic compound may be smaller than a silicon oxide film in relative dielectric constant.

Besides, in the method of manufacturing a semiconductor device, preferably, said second organic compound may be smaller than a silicon oxide film in relative dielectric constant.

According to still another aspect of the present invention, there is also provided a semiconductor device comprising: a semiconductor substrate (30, 40, 50); an organic film having low dielectric constant and including no silicon (35, 45, 55, 63, 72, 83, 85, 109), said organic film being formed on said semiconductor substrate; and a silicon included organic film (34, 44, 46, 54, 56, 62, 64, 73, 82, 84, 86, 103, 105) formed on a lower surface, an upper surface, or both lower and upper surfaces of said organic film having low dielectric constant (35, 45, 55, 63, 62, 83, 85, 109).

Further, in the semiconductor device, a conductive film may be selectively buried into an opening portion of stacked films consisting of said silicon included organic film formed on a lower surface, an upper surface, or both lower and upper surfaces of said organic film having low dielectric constant.

Further, in the semiconductor device, said silicon included organic film (34, 44, 46, 54, 56, 62, 64, 73, 82, 84, 86, 103, 105) may be formed by a polymer of divinyl-siloxane-benzocyclobutene.

According to still yet another aspect of the present invention, there is also provided a semiconductor device comprising: a silicon included organic film (34, 44, 46, 54, 56, 62, 64, 73, 82, 84, 86, 103, 105) composed of a first organic compound including silicon; and a silicon non-included organic film (35, 45, 55, 63, 72, 83, 85, 109) which is composed of a second organic compound including substantially no silicon and which is connected with said silicon included organic film (34, 44, 46, 54, 56, 62, 64, 73, 82, 84, 86, 103, 105). In this semiconductor device, the silicon non-included organic film (35, 45, 55, 63, 72, 83, 85, 109) can be etched by gas plasma of mixture nitrogen and hydrogen at a high selectivity against the silicon included organic film (34, 44, 46, 54, 56, 62, 64, 73, 82, 84, 86, 103, 105). Thus, this semiconductor device can be manufactured with the high selectivity of the etching.

Further, a semiconductor device according to the present invention comprising: a substrate (61, 81–83); a silicon included organic film (62, 84) which is formed on an upper side of said substrate (61, 81–83) and which is composed of a first organic compound including silicon; a silicon non-included organic film (63, 85) which is formed on an upper side of said silicon included organic film (62, 84) and which is composed of a second organic compound including substantially no silicon and in which a wiring trench (69b, 91) is formed down to said silicon included organic film (62, 84); and a conductor (70, 92) formed within said wiring trench (69b, 91).

Further, in the semiconductor device, preferably, the first organic compound may include a polymer of a compound having the following structural formula;

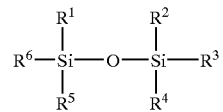

wherein R1 through R6: hydrocarbon radical.

Further, in the semiconductor device, preferably, the first organic compound may include a polymer of divinyl-siloxane-benzocyclobutene.

Further, in the semiconductor device, preferably, the first organic compound may include a polymer of siloxane-polyimide.

According to a further aspect of the present invention, there is also provided a hard mask, characterized in that said hard mask is for use in etching an organic film (45, 55, 63, 85) composed of an organic compound including no silicon, said hard mask including a silicon included organic film (46, 56, 64, 86) composed of an organic compound including silicon.

According to a yet further aspect of the present invention, there is also provided an etching stopper film, characterized in that said etching stopper film is for use in etching an organic film (35, 45, 55, 63, 83, 85) composed of an organic compound including no silicon, said etching stopper film including a silicon included organic film (32, 44, 54, 62, 82, 84) composed of an organic compound including silicon.

DETAILED DESCRIPTION OF THE PREFERRED EMBODIMENTS

Figure 1:
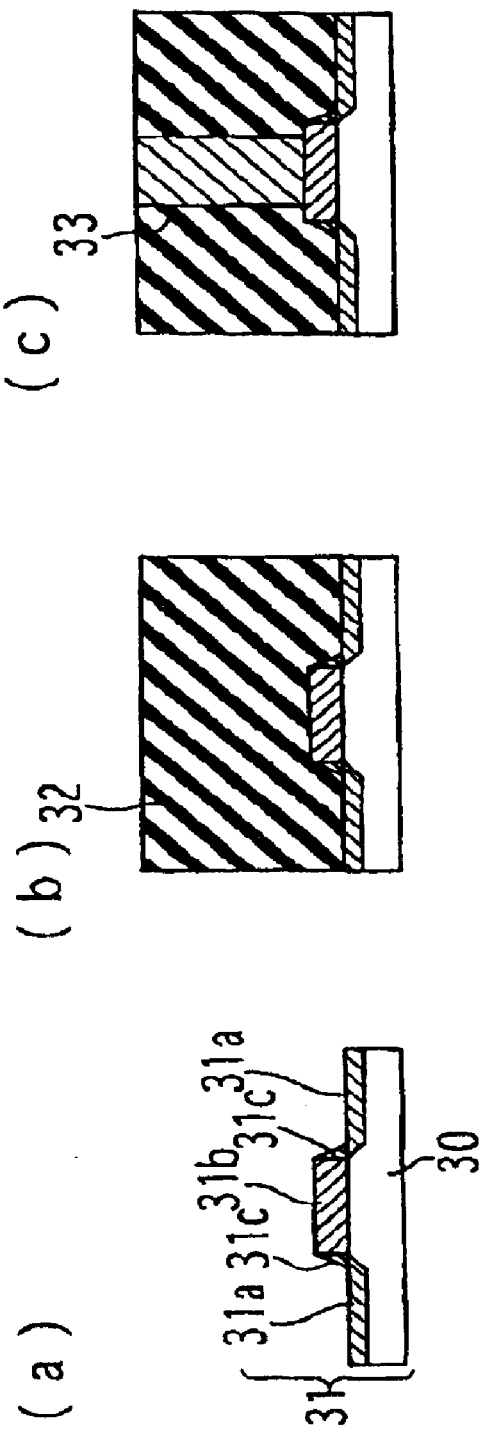
FIG. 1 is a sectional view for schematically showing a method of manufacturing a semiconductor device according to an embodiment 1 of the present invention.

Now, referring to FIGS. 1 through 18, description will proceed to a method of manufacturing a semiconductor device according to preferred embodiments of the present invention. In the preferred embodiments, the semiconductor device is a semiconductor integrated circuit.

In a method of manufacturing a semiconductor integrated circuit according to an embodiment of the present invention, a silicon included organic film composed of an organic compound including silicon and a silicon non-included organic film composed of an organic compound including no silicon are stacked to form a stacked structure.

Further, the silicon non-included organic film is etched by $N_2/H_2$ plasma generated in an etching gas including both nitrogen gas and hydrogen gas. Herein, the silicon non-included organic film is readily etched by the $N_2/H_2$ plasma. On the contrary, the silicon included organic film has etching-resistance against the N2/H2 plasma, in other words, the silicon included organic film is hardly etched by the $N_2/H_2$ plasma. Accordingly, when the stacked structure in which the silicon included organic f and the silicon non-included organic film are stacked is etched by the $N_2/H_2$ plasma, a high selectivity of the etching can be achieved.

In addition, the organic compound of which the silicon included organic film is composed is preferably a polymer of an organic compound having siloxane bond (Si—O—Si). In particular, it is preferable that a polymer of an organic compound having the following structural formula is used as the organic compound;

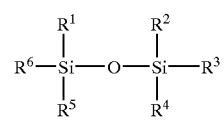

wherein each of R1 through R6 is hydrocarbon radical.

Herein, it is particularly Preferable that a polymer of divinyl-siloxane-benzocyclobutene is used as the polymer of an organic compound having the above structural formula. The divinyl-siloxane-benzocyclobutene has the following structural formula;

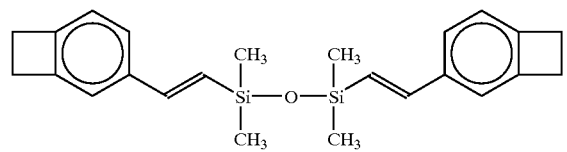

When the divinyl-siloxane-benzocyclobutene is polymerized, the polymer of divinyl-siloxane-benzocyclobutene having the following structural formula is formed;

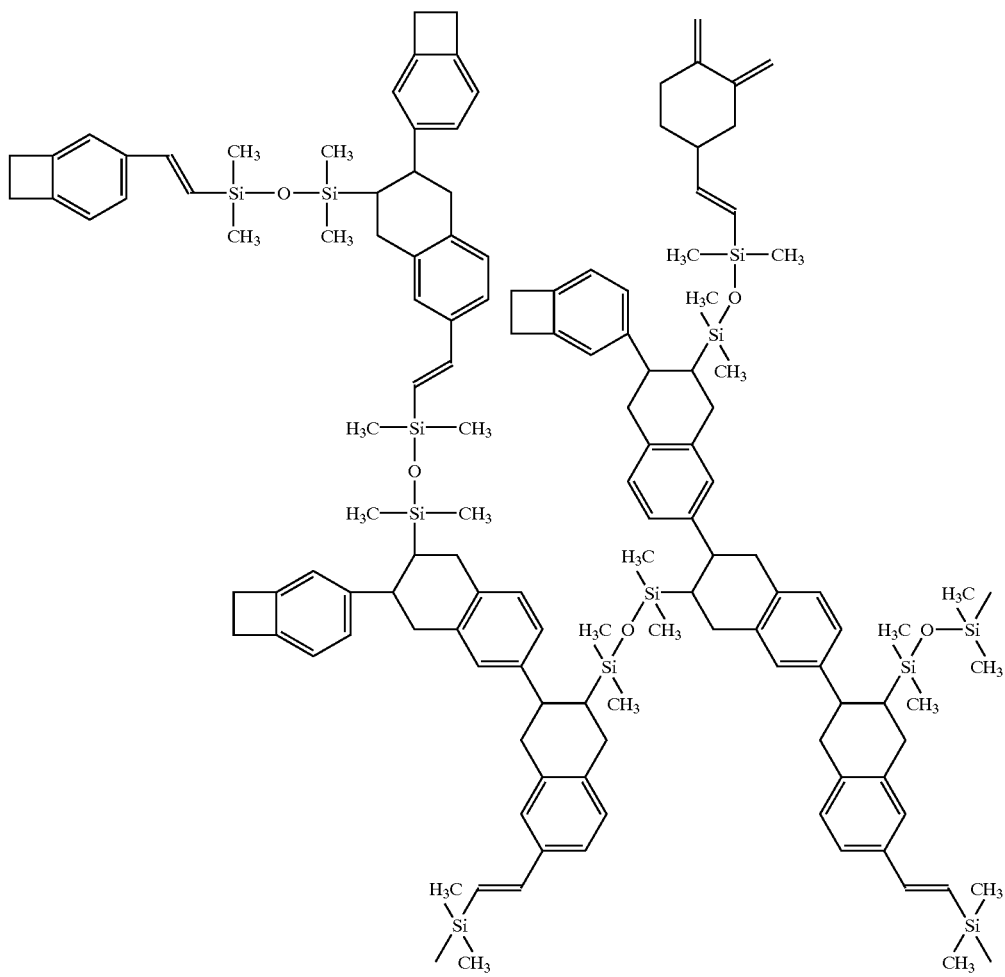

Further, it is also preferable that a polymer of siloxane-polyimide is used as the polymer of an organic compound having the above structural formula. The polymer of siloxane-polyimide has the following structural formula;

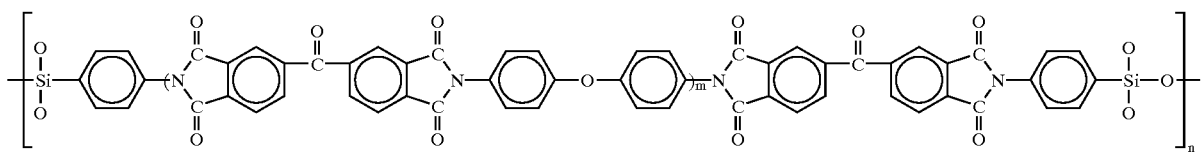

The silicon included organic film can be formed by not only spin coating method but also plasma polymerization method. When the spin coating method is used, at first, a monomer, that is a starting material, is spin coated on a substrate. Further, the monomer is heat-polymerized by annealing the substrate to form the silicon included organic film. On the other hand, when the plasma polymerization method is used, at first, a monomer, that is a starting material, is vaporized to generate a monomer vapor. The monomer vapor is introduced into an inert gas and is further polymerized to form the silicon included organic film.

On the other hand, the above-mentioned silicon non-included organic film can be used in the following three forms;

(1) An interlayer insulating film for forming a semiconductor device (2) A photo resist (3) A film for preventing reflection during photolithography process When the silicon non-included organic film is used as the interlayer insulating film for forming a semiconductor device, it is preferable that the silicon non-included organic film is smaller than a silicon oxide film in relative dielectric constant. Silk (Trademark of a chemical material made by Dow Chemical Corporation in U.S.A.) can be used as such a silicon non-included organic film having a lower relative dielectric constant than a silicon oxide film. Further, as a silicon non-included organic film, a polymer of naphthalene fluoride, naphthalene, maleimide-benzocyclobutene, perflorocyclobutene-aromaticether (PFCB), and benzocyclobutene fluoride can be used.

Naphthalene fluoride, naphthalene, maleimide-benzocyclobutene, perflorocyclobutene-aromaticether (PFCB), and benzocyclobutene fluoride have the following structural formulas, respectively.

Naphthalene fluoride:

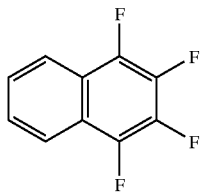

Naphthalene:

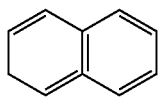

Maleimide-benzocyclobutene:

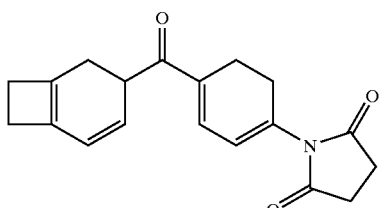

Perflorocyclobutene-aromaticether (PFCB):

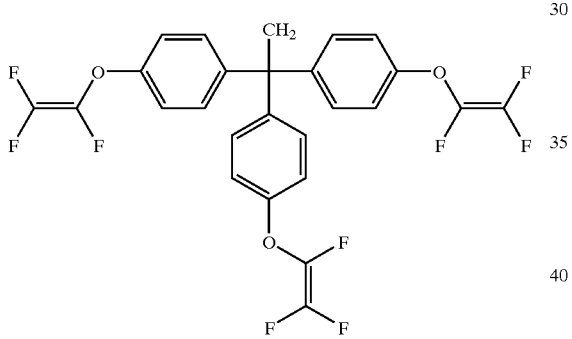

Benzocyclobutene fluoride:

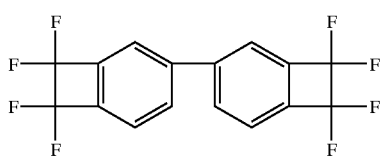

Furthermore, the silicon non-included organic film used as the interlayer insulating film for forming a semiconductor device can be formed by a polymer polymerized by a derivative of benzocyclobutene having the following structural formula;

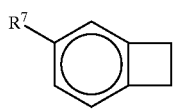

wherein R7 is an unsaturated hydrocarbon radical, such as a vinyl radical. It is preferable that the silicon non-included organic film is formed by a polymer polymerized by a derivative of benzocyclobutene having the above structural formula. This is because no residual product is produced, when the polymer is formed from a monomer of the derivative of benzocyclobutene.

Further, the silicon non-included organic film used as the interlayer insulating film for forming a semiconductor device can be an organic film formed by a polymer of a derivative of benzocyclobutene having the following structural formula;

[15]

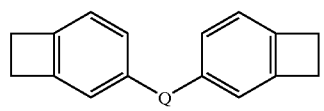

wherein Q is a radical having any one of the structural formulas among the following group of structural formulas;

[16]

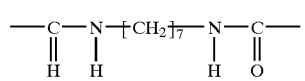

[17]

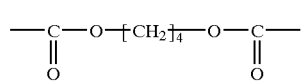

[18]

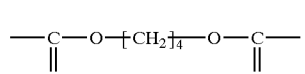

[19]

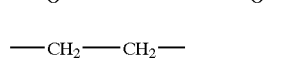

[20]

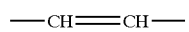

[21]

[22]

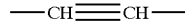

[23]

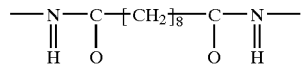

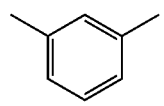

[24]

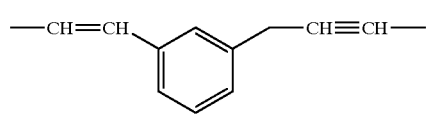

[25]

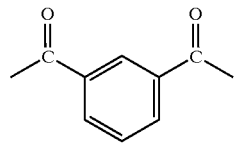

It is preferable that the silicon non-included organic film is formed by a polymer polymerized by a derivative of benzocyclobutene having the above [15] through [25] structural formulas. This is because no residual product is produced, when the polymer is formed from a monomer of the derivative of benzocyclobutene.

Further, the silicon non-included organic film used as the interlayer insulating film for forming a semiconductor device can be an organic film formed by an organic compound having the following structural formula;

polyimide:

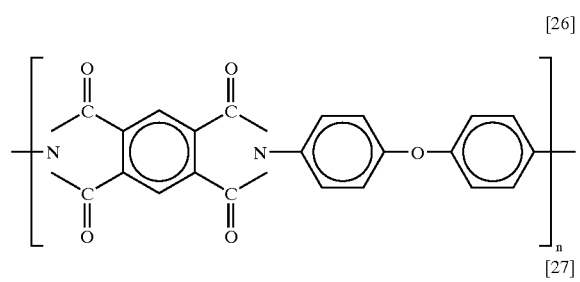

[26]

[27]

fluorocarbon polymers:

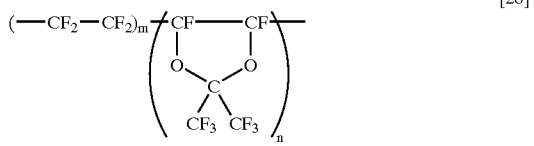

[28]

[29]

palyren:

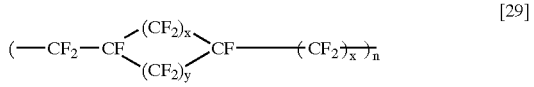

[30]

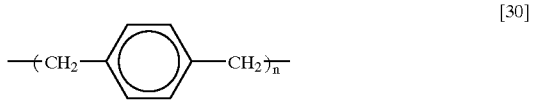

[31]

[32]

polyallyl-ether and derivative fluoride thereof:

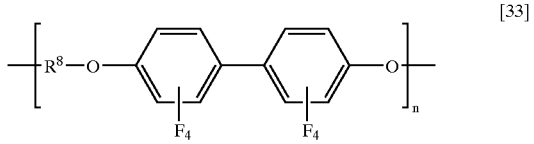

[33]

Hereunder, description is made about methods of forming the silicon included organic film and the silicon non-included organic film, methods of etching the same, etching characteristics thereof, respectively. In the description, an organic film formed by a polymer of divinyl-siloxane-benzocyclobutene (hereunder simply called as "BCB film") is used as the silicon included organic film. On the other hand, a Silk film formed by the above-mentioned Silk (Trademark of a chemical material made by Dow Chemical Corporation in U.S.A.) is used as the silicon non-included organic film.

Figure 18:
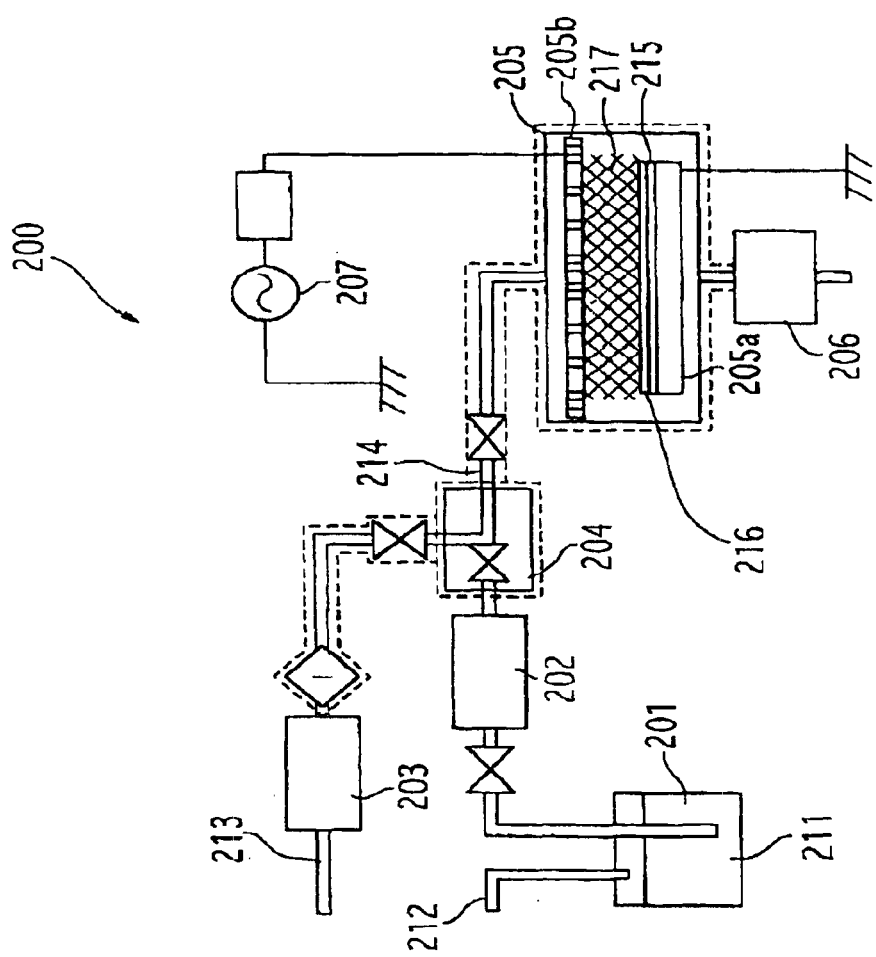
FIG. 18 is a block diagram for schematically showing an apparatus for forming a BCB film composed of a polymer of divinyl-siloxane-benzocyclobutene.
Figure 19:
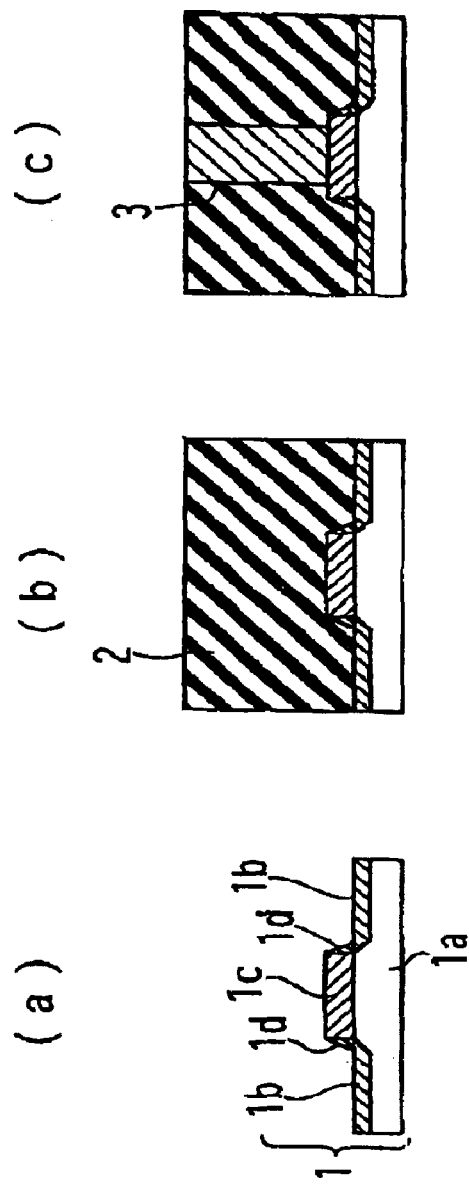
FIG. 19 is a sectional view for schematically showing a conventional method of manufacturing a semiconductor device.
Figure 20:
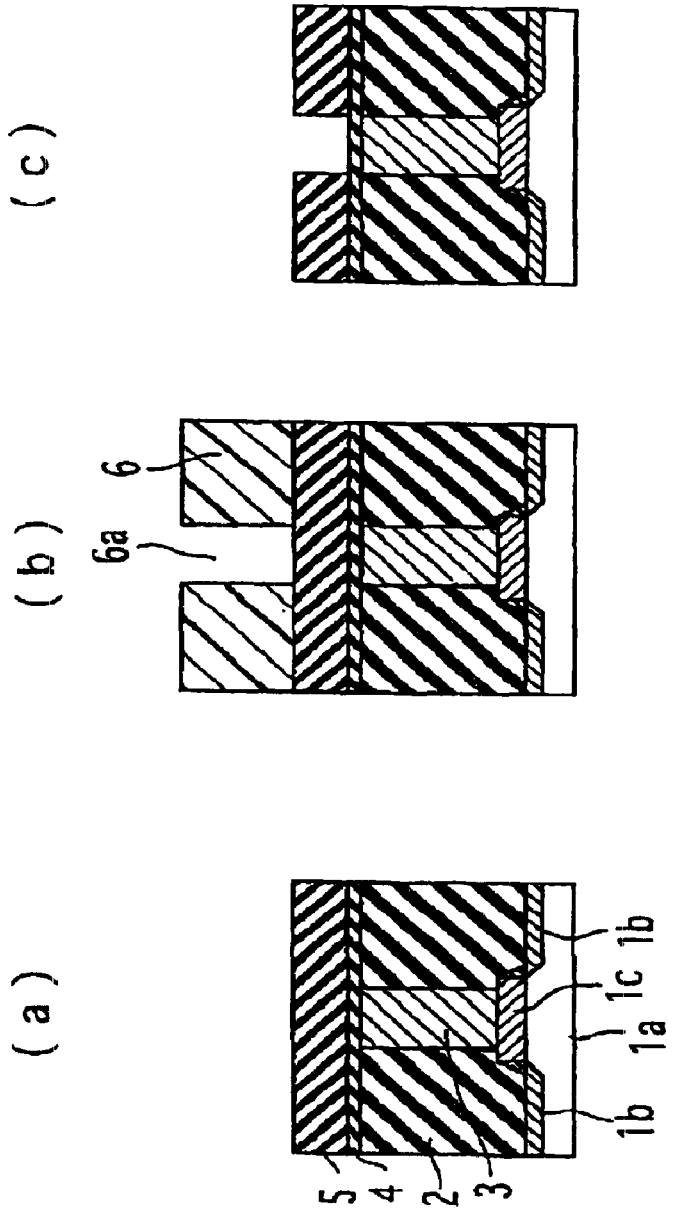
FIG. 20 is a sectional view for schematically showing a conventional method of manufacturing a semiconductor device.
Figure 21:
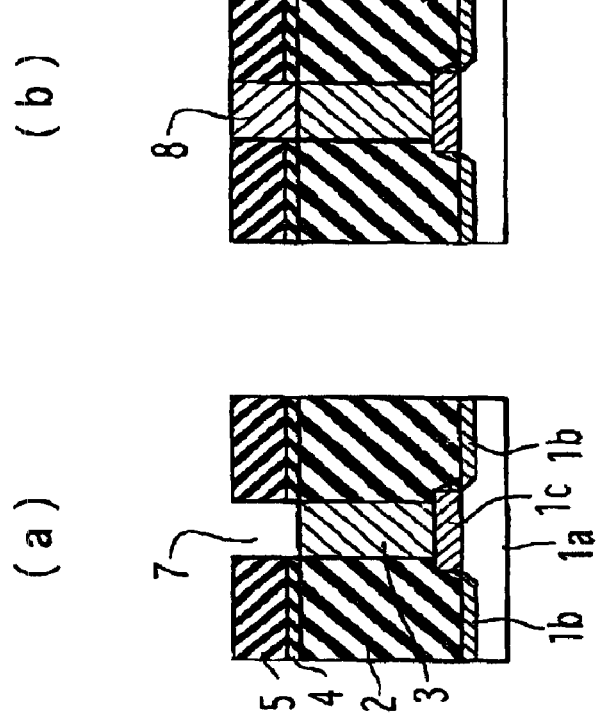
FIG. 21 is a sectional view for schematically showing a conventional method of manufacturing a semiconductor device.
Figure 22:
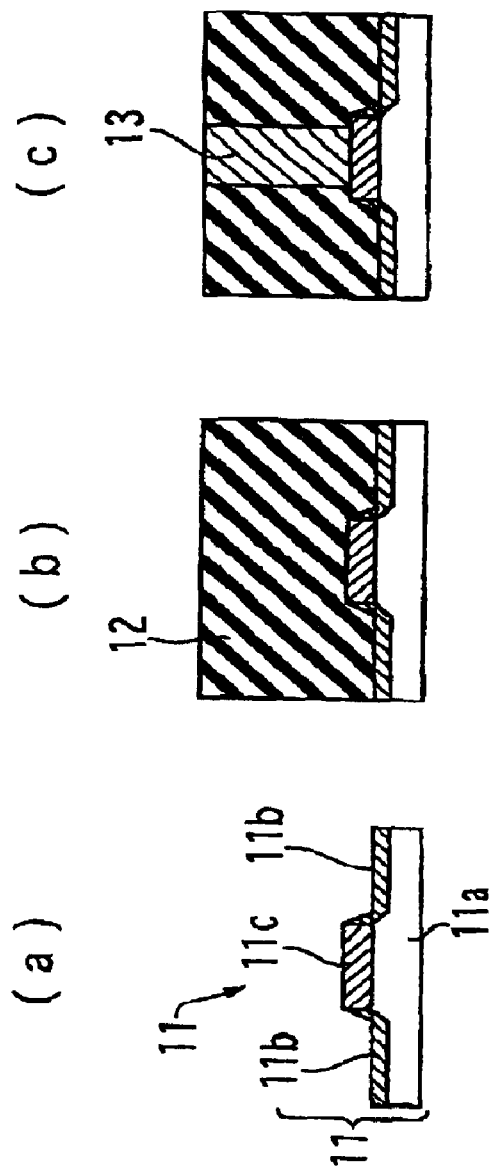
FIG. 22 is a sectional view for schematically showing another conventional method of manufacturing a semiconductor device.
Figure 23:
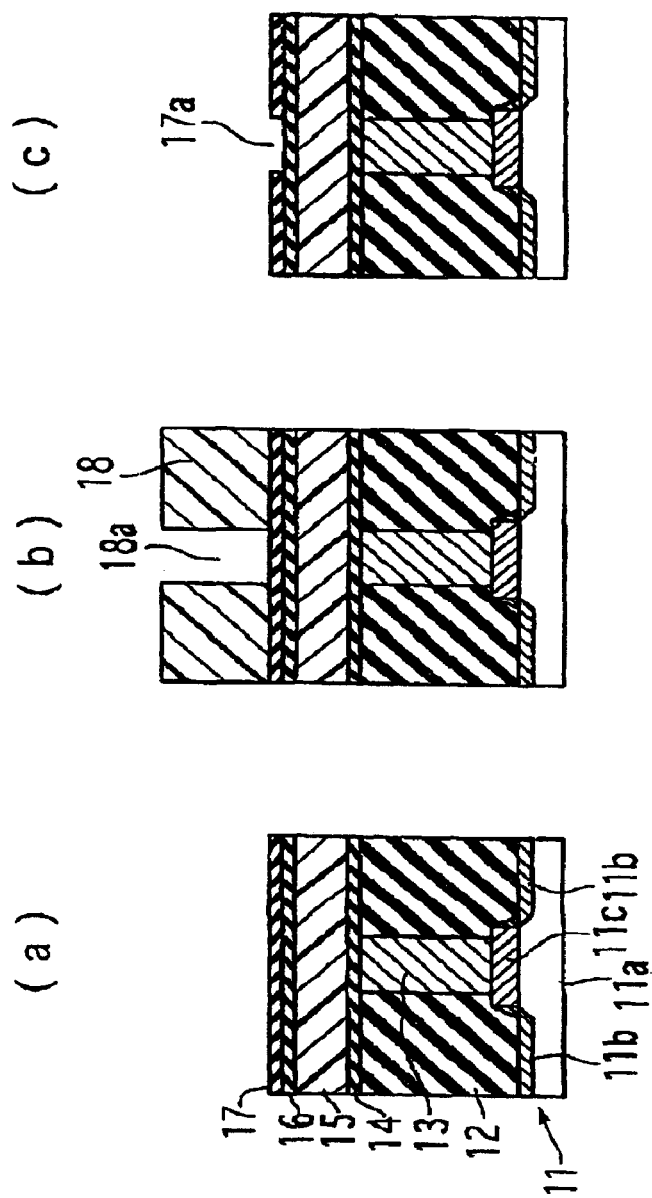
FIG. 23 is a sectional view for schematically showing another conventional method of manufacturing a semiconductor device.
Figure 24:
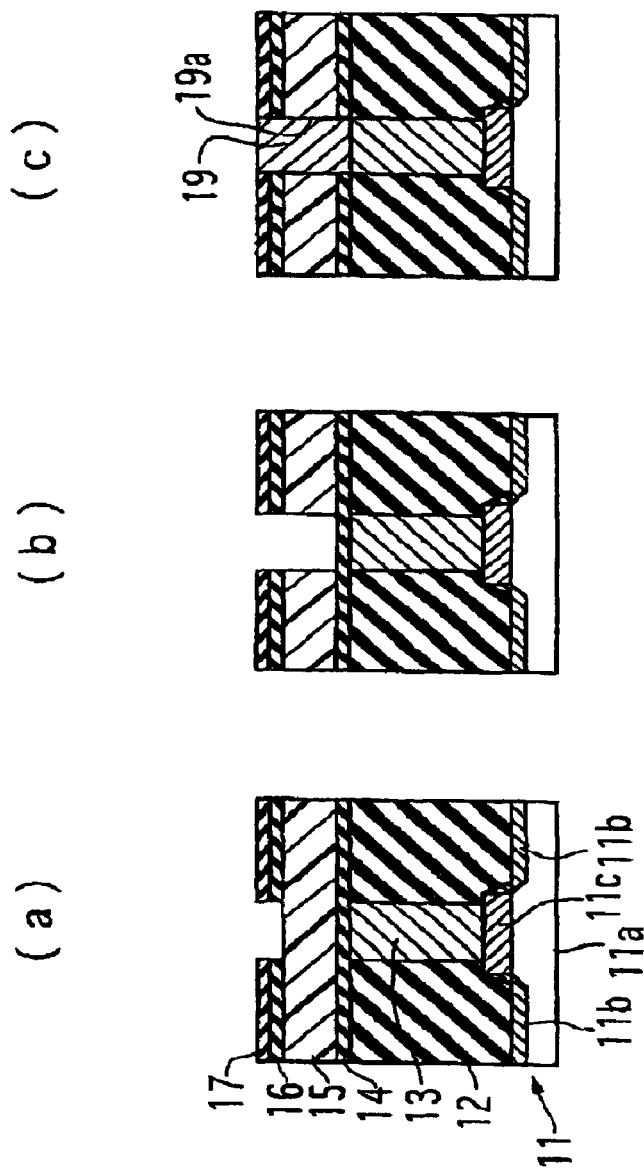
FIG. 24 is a sectional view for schematically showing another conventional method of manufacturing a semiconductor device.
Figure 25:
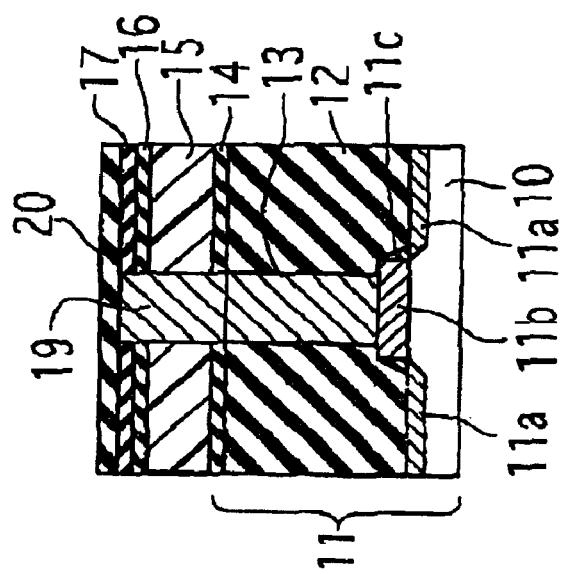
FIG. 25 is a sectional view for schematically showing another conventional method of manufacturing a semiconductor device.

The BCB film is formed by the plasma polymerization method. FIG. 18 shows a plasma polymerization apparatus 200. The plasma polymerization apparatus 200 includes a material tank 201, a liquid flow controller 202, a gas flow controller 203, a vaporizer 204, a vacuum reaction chamber 205, a pump 206, and an RF power supply 207.

The material tank 201 supplies divinyl-siloxane-benzocyclobutene monomer 211 to the vaporizer 204. In the material tank 201, stored is the divinyl-siloxane-benzocyclobutene monomer 211. The divinyl-siloxane-benzocyclobutene monomer 211 is a liquid at room temperature. On the other hand, a pressured He gas 212 is supplied to the material tank 201. The divinyl-siloxane-benzocyclobutene monomer 211 is pressured by the pressured He gas 212 and transferred into the vaporizer 204 through the liquid flow controller 202.

The vaporizer 204 vaporizes the divinyl-siloxane-benzocyclobutene monomer 211 to produce a vaporized monomer 214 The vaporizer 204 then supplies the vaporized monomer 214 to the vacuum reaction chamber 205 He carrier gas 213 is supplied to the vaporizer 204 through the gas flow controller 203. The divinyl-siloxane-benzocyclobutene monomer 211 and the He carrier gas 213 are mixed and transferred into a vaporization chamber (not shown) contained in the vaporizer 204. In the vaporization chamber, pressure is reduced down to approximately 1.3× 101 Pa while atmosphere is heated up to approximately 200° C. The divinyl-siloxane-benzocyclobutene monomer 211 transferred into the vaporization chamber is vaporized instantaneously to be produced as the vaporized monomer 214. Vaporization ability of the divinyl-siloxane-benzocyclobutene monomer 211 is approximately between 0.1 and 0.5 g/min, both inclusive. The vaporized monomer 214 is then transferred into the vacuum reaction chamber 205.

In the vacuum reaction chamber 205, the vaporized monomer 214 is polymerized to form a BCB film 216 on a substrate 215. In the vacuum reaction chamber 205, pressure is reduced by the pump 206. A substrate heater 205a and a showerhead 205b are provided in the vacuum reaction chamber 205. The substrate heater 205a is connected to an LF (low frequency) power supply (not shown) that supplies the substrate heater 205a with a low frequency voltage of 430 kHz. On the other hand, the showerhead 205b is connected to the RF power supply 207 that supplies the showerhead 205b with a high frequency voltage of 13.56 MHz. When the low frequency voltage of 430 kHz is supplied to the substrate heater 205a and the high frequency voltage of 13.56 MHz is supplied to the shower head 205b, He plasma 217 is generated between the substrate heater 205a and the shower head 205b. When the vaporized monomer 214 is introduced into the He plasma 217, ring-opening reaction of cyclo radical and polymerization reaction of vinyl radical both included in the divinyl-siloxane-benzocyclobutene having the above mentioned structural formula [6] are progressed. As a result, the BCB film 216 consisting of the divinyl-siloxane-benzocyclobutene polymer having the above mentioned structural formula [7] is formed on the substrate 215. By such a film-forming method, the BCB film 216 having heat resistance property of not lower than 400° C. and relative dielectric constant k of 2.4 to 2.7 can be obtained actually.

On the other hand, the above-mentioned Silk constituting the silicon non-included organic film is an all-aromatic organic compound and is composed of carbon and hydrogen. The Silk film formed by a polymer of the Silk is formed by the following processes. At first, monomer solution of Silk is applied on a substrate. The substrate on which the monomer solution is applied is then annealed at approximately 100° C. to 150° C. in nitrogen atmosphere. Thereby, solvent contained in the monomer solution is dried. The substrate is thereafter heated at 400° C. for approximately thirty minutes. Heat polymerization reaction is generated by the heating and the Silk film consisting of the polymer of the Silk is formed accordingly. The Silk film has heat resistance property of not lower than 450° C. and relative dielectric constant k of 2.6.

In the following table [A], depicted are etching speeds, when the BCB film and the Silk film both formed by the above-mentioned processes are etched, respectively. The etching speeds are shown not only in the case (1) that etching is conducted by using an etching gas of mixed $N_2$ gas and $H_3$ gas but also in the case (2) that etching is conducted by using an etching gas of mixed $N_2$ gas and $O_2$ gas.

TABLE A

|  | $N_2 + H_2$ GAS | $N_2 + O_2$ GAS |
|---|---|---|
| Silk ™ Film | 350 nm/min | 1400 nm/min |
| BCB Film | 0 nm/min | 120 nm/min | wherein the etchings are conducted on the following conditions In the case (1) that the etching is conducted by using the etching gas of mixed $N_2$ gas and $H_2$ gas, flow quantities of the N2 gas and the H2 gas are 200 sccm, respectively Namely, a composition (mol) ratio of the mixed gas of the N2 gas and the H2 gas is $[N_2]:[H_2]=1:1$. On the other hand, in the case (2) that the etching is conducted by using the etching gas of mixed $N_2$ gas and $O_2$ gas, a flow quantity of the $N_2$ gas is 150 sccm while a flow quantity of the $O_2$ gas is 30 sccm. Namely, a composition (mol) ratio of the mixed gas of the $N_2$ gas and the $O_2$ gas is $[N_2]:[O_2]=5:1$. Besides, an etching apparatus used therein is such an etching apparatus having upper and lower electrodes of parallel plate type. A distance between the upper and the lower electrodes is 30 (mm). Further, an electric power supplied to the upper electrode is 1800 (W) while an electric power supplied to the lower electrode is 150 (W). In addition, an etching pressure is 2.7 (Pa).

As shown in the [Table A], as regards the Silk film, that is, the silicon non-included organic film, the etching of the Silk film is progressed, when the etching is conducted by using the etching gas of mixed $N_2$ gas and $H_2$ gas. On the contrary, as regards the BCB film, that is, the silicon included organic film, the etching of the BCB film is hardly progressed, when the etching is conducted by using the etching gas of mixed $N_2$ gas and $H_2$ gas. Thus, the BCB film has etching resistance property against plasma generated in the mixed gas of $N_2$ gas and $H_2$ gas. This is assumed to be on the ground that silicon existing in the organic macromolecule is inert against hydrogen plasma.

On the other hand, the BCB film is etched, when the etching is conducted by using the etching gas of mixed $N_2$ gas and $O_2$ gas. This is because the BCB film is capable of being etched by $N_2/O_2$ plasma generated in the mixed gas of $N_2$ gas and $O_2$ gas. The other silicon included organic films, such as a siloxane-polyimide polymeric film, have etching characteristics similar to that of the BCB film.

Besides, it is alternatively possible that the etching gas for etching the silicon non-included organic film does not include $N_2$ gas but includes $H_2$ gas of 100%. However, when the etching gas for etching the silicon non-included organic film is the mixed gas of $N_2$ gas and $H_2$ gas, the etching speed is increased. It is therefore preferable that the mixed gas of $N_2$ gas and $H_2$ gas is used as the etching gas for etching the silicon non-included organic film. In particular, it is further preferable that a composition (mol) ratio of the mixed gas of the $N_2$ gas and the $H_2$ gas is $[N_2]:[H_2]=1:3$. When the composition (mol) ratio of the mixed gas of the $N_2$ gas and the $H_2$ gas is $[N_2]:[H_2]=1:3$, the etching speed can become approximately twice as large as that in a case of H2 gas of 100%.

Further, when the silicon included organic film is etched, it is desirable that a fluorine gas, such as fluorocarbon, is added to the etching gas for etching the silicon included organic film, that is, the mixed gas of the $NT_2$ gas and the $O_2$ gas. Since vapor pressure of fluoride of silicon is low, remainder does not remain easily after the etching of the silicon included organic film. Herein, it is desirable that a composition (mol) ratio of the fluorine gas among all the etching gas is 0.1 to 5.0 mol %.

Furthermore, it is desirable that a silicon including ratio of the silicon included organic film is not more than 45% in mass in view of relative dielectric constant and etching characteristics. In particular, it is further desirable that the silicon including ratio is not more than 20% in mass. When the silicon including ratio exceeds 50% in mass, the relative dielectric constant is remarkably increased. In addition, when the silicon including ratio exceeds 50% in mass, the etching characteristics of the silicon included organic film are deteriorated. Namely, it becomes difficult to etch the silicon included organic film, even though the etching is conducted by using the etching gas of mixed $N_2$ gas and $O_2$ gas. On the other hand, it is also desirable that the silicon including ratio of the silicon included organic film is not fewer than 1% in mass in view of the etching resistance property against the $N_2/H_2$ plasma.

As described above, a method of manufacturing a semiconductor device according to this embodiment of the present invention comprises the steps of (A) stacking a silicon included organic film formed by an organic compound including silicon and a silicon non-included organic film formed by an organic compound including no silicon; and (B) etching the silicon non-included organic film by using the etching gas of mixed $N_2$ gas and $H_2$ gas. Such a method of manufacturing a semiconductor device can be used in the following three forms;

(1) An etching process for etching the silicon non-included organic fill by using the silicon included organic film as a mask.
(2) Form of an opening portion for forming the opening portion in the silicon non-included organic film by using the silicon included organic film as an etching stopper.
(3) Selective remove for selectively removing a photo resist and a reflection preventing film both of which are the silicon non-included organic films from an upper side of the silicon included organic film or from an opening portion formed in the silicon included organic film.

Referring now to FIGS. 1 through 17, description proceeds to several embodiments for the above forms of use (1), (2) and (3).

[Embodiment 1]

Figure 2:
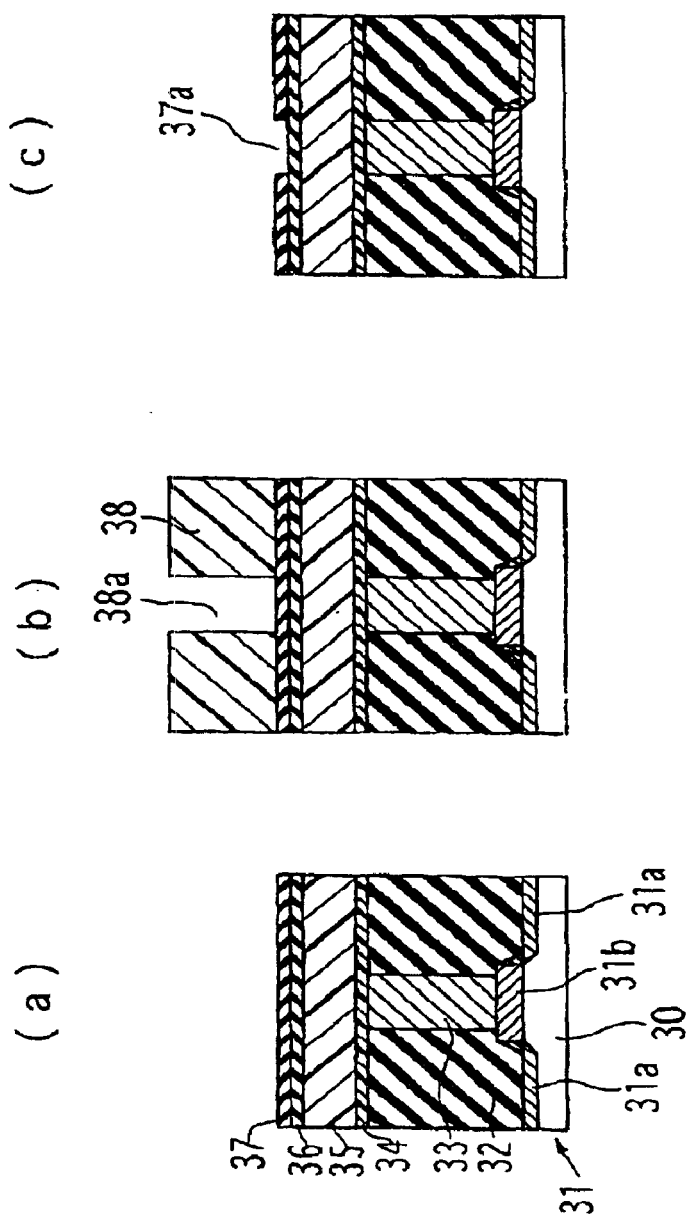
FIG. 2 is a sectional view for schematically showing a method of manufacturing a semiconductor device according to an embodiment 1 of the present invention.
Figure 3:
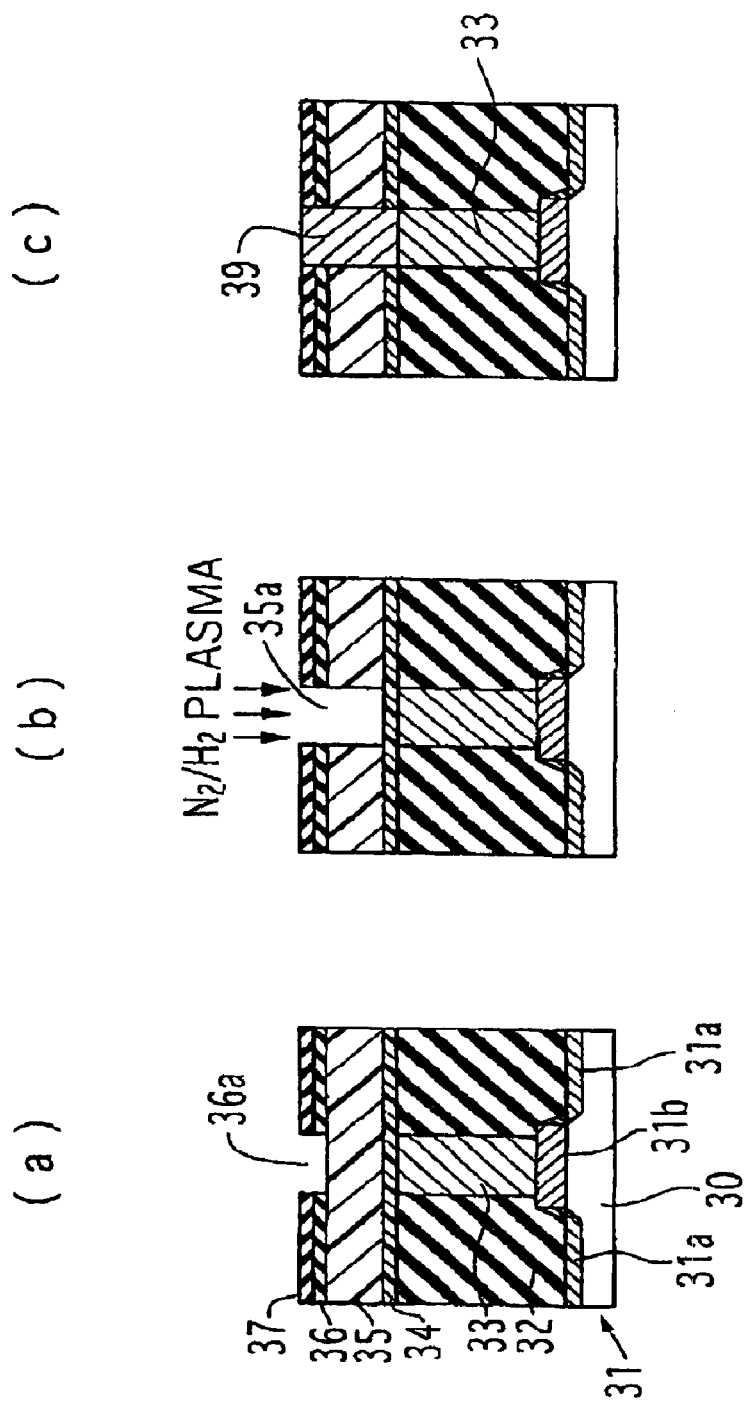
FIG. 3 is a sectional view for schematically showing a method of manufacturing a semiconductor device according to an embodiment 1 of the present invention.

FIGS. 1, 2, and 3 are sectional views for schematically showing a method of manufacturing a semiconductor device according to the embodiment 1 of the present invention. In the embodiment 1, the opening portion is formed in the silicon non-included organic film by using the silicon included organic film as an etching stopper.

At first, as illustrated in FIG. 1(a), a MOS (Metal Oxide Semiconductor) transistor 31 is formed on an upper surface of a silicon substrate 30. In particular, source/drain 31a, a gate 31b and sidewalls 31c of which the MOS transistor 31 is composed are formed on the upper surface of the silicon substrate 30.

Next, as illustrated in FIG. 1(b), as an interlayer insulating film, a silicon oxide film 32 is formed thereon, so that the MOS transistor 31 is overlaid by the silicon oxide film 32. Further, as illustrated in FIG. 1(c), a plug 33 which is connected to the source/drain 31a of the MOS transistor 31 is formed through the silicon oxide film 32. The plug 33 is formed by the use of a conductive plug, such as a tangsten plug.

Thereafter, as illustrated in FIG. 2(a), a BCB film 34 is formed on the silicon oxide film 32 and the plug 33, so that the silicon oxide film 32 and the plug 33 are overlaid by the BCB film 34. As mentioned before, the BCB film 34 is the silicon included organic composed of a polymer of divinyl-siloxane-benzocyclobutene. The BCO film 34 has a relative dielectric constant lower than that of a silicon oxide film. The relative dielectric constant of the BCB film 34 is 2.6.

Further, a Silk film 35 is formed on an upper surface of the BCB film 34. The Silk film 35 is formed by spin on coating. As will later be described more in detail, the BCB film 34 positioned under the Silk film 35 functions as an etching stopper, when the Silk film 35 is etched.

Furthermore, a silicon nitride film 36 and a silicon oxide film 37 are formed one by one on an upper surface of the Silk film 35. The silicon nitride film 36 and the silicon oxide film 37 function as hard masks, when the Silk film 35 is etched.

Next, as illustrated in FIG. 2(b), a photo resist 38 is formed on an upper surface of the silicon oxide film 37. Further, a resist pattern 38a is formed in the photo resist 38 by the use of photolithography technique.

Further, as illustrated in FIG. 2(c), the silicon oxide film 37 is etched using the photo resist 38 as an etching mask to form an opening portion 37a. Furthermore, the photo resist 38 is removed from the upper surface of the silicon oxide film 37 by the use of oxygen plasma. At this time, the upper surface of the Silk film 35 is covered by the silicon nitride film 36. The Silk film 35 is therefore not exposed to the oxygen plasma. Accordingly, the Silk film 35 is never etched, when the photo resist 38 is removed.

Moreover, as illustrated in FIG. 3(a), the silicon nitride film 36 is etched by using the silicon oxide film 37 as a hard mask to form a hard mask pattern 36a.

Thereafter, the Silk film 35 is etched by using the silicon oxide film 37 and the silicon nitride film 36 as hard masks, as illustrated in FIG. 3(b) As a result, an opening portion 35a is formed in the Silk film 35 down to the BCB film 34. Herein, the Silk film 35 is etched by using the etching gas of mixed $N_2$ gas and $H_2$ gas. At this time, the BCB film 34 has an etching resistance property against $N_2/H_2$ plasma. The etching of the Silk film 35 is stopped by the upper surface of the BCB film 34.

Further, the BCB film 34 positioned at the bottom of the opening portion 35a is etched to form a contact reaching the plug 33. Furthermore, not only a Ta/TaN barrier film (not shown) but also a copper thin film for electrode (not shown) that is used as an electrode in plating are formed by sputtering method.

Thereafter, a copper is burried in the contact by plating. Further, unnecessary portions of the Ta/TaN barrier film and the copper thin film are removed by the use of the CMP method. As a result, a copper wiring 39 is formed, as illustrated in FIG. 3(c).

In the method of manufacturing a semiconductor device according to the embodiment 1, the BCB film 34 of which relative dielectric constant is approximately one third of that of a silicon nitride film is used as an etching stopper. Accordingly, interlayer capacitance can be reduced in a semiconductor device thus manufactured.

[Embodiment 2]

Figure 4:
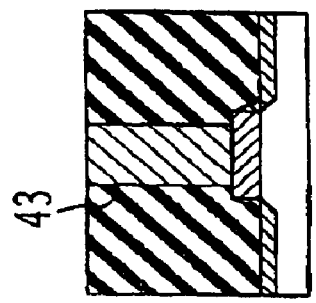
FIG. 4 is a sectional view for schematically showing a method of manufacturing a semiconductor device according to an embodiment 2 of the present invention.
Figure 4:
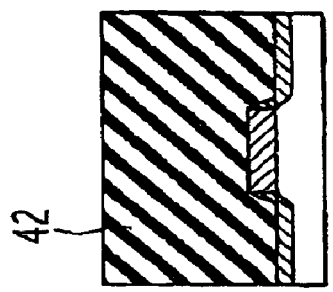
Figure 4:
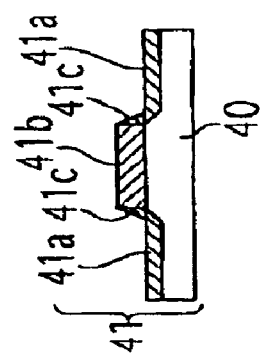
Figure 5:
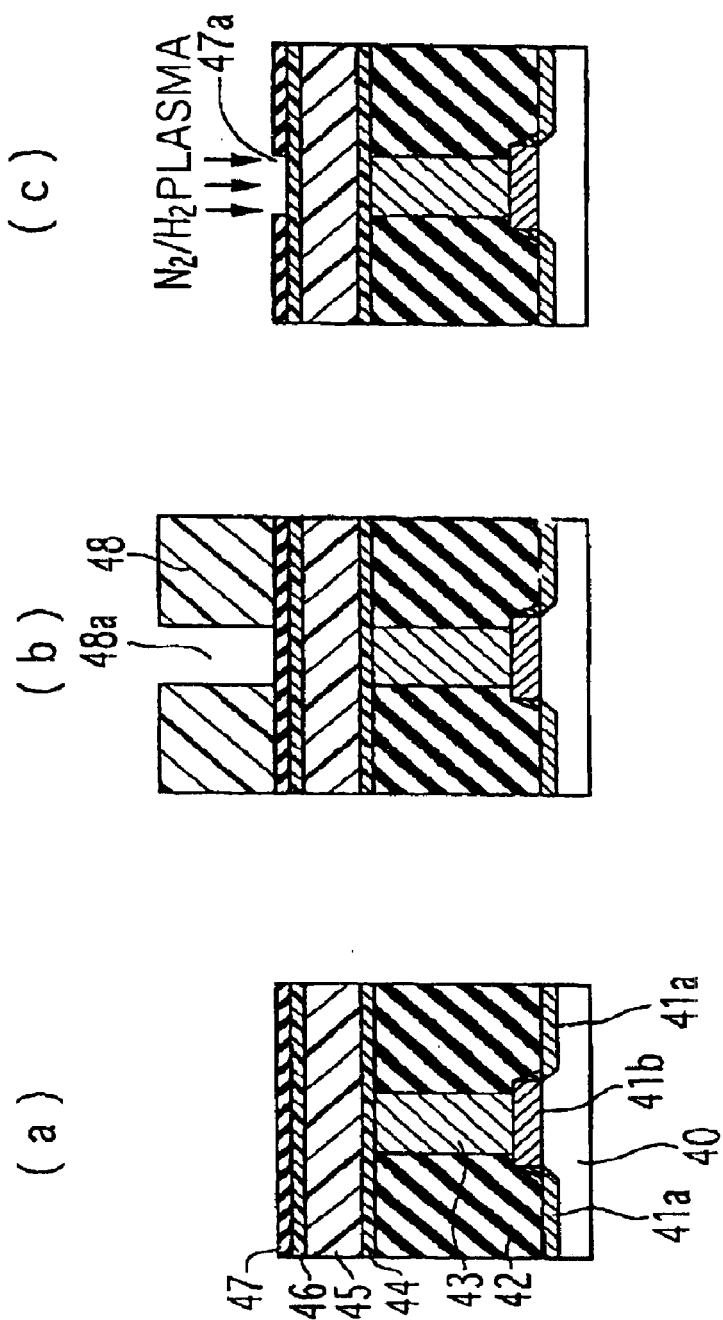
FIG. 5 is a sectional view for schematically showing a method of manufacturing a semiconductor device according to an embodiment 2 of the present invention.
Figure 6:
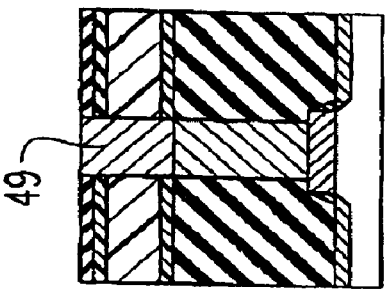
FIG. 6 is a sectional view for schematically showing a method of manufacturing a semiconductor device according to an embodiment 2 of the present invention.
Figure 6:
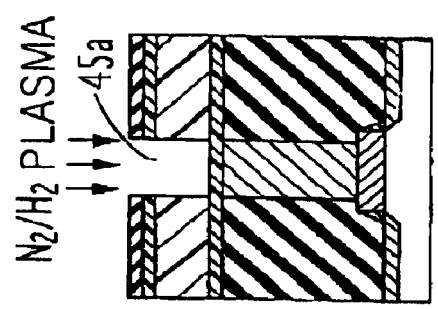
Figure 6:
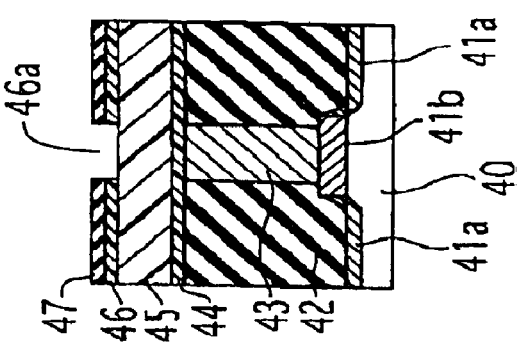

FIGS. 4, 5, and 6 are sectional views for schematically showing a method of manufacturing a semiconductor device according to the embodiment 2 of the present invention. In the embodiment 2, the opening portion is formed in the silicon non-included organic film by using one silicon included organic film as a hard mask and another silicon included organic film as an etching stopper.

At first, as illustrated in FIG. 4(a), a MOS (Metal Oxide Semiconductor) transistor 41 is formed on an upper surface of a silicon substrate 40. In particular, source/drain 41a, a gate 41b and sidewalls 41c of which the MOS transistor 41 is composed are formed on the upper surface of the silicon substrate 40.

Next, as illustrated in FIG. 4(b), as an interlayer insulating film, a silicon oxide film 42 is formed thereon, so that the MOS transistor 41 is overlaid by the silicon oxide film 42. Further, as illustrated in FIG. 4(c), a plug 43 which is connected to the source/drain 41a of the MOS transistor 41 is formed through the silicon oxide film 42. The plug 43 is formed by the use of a conductive plug, such as a tungsten plug.

Thereafter, as illustrated in FIG. 5(a), a first BCB film 44 is formed on the silicon oxide film 42 and the plug 43, so that the silicon oxide film 42 and the plug 43 are overlaid by the first BCB film 44. The first BCB film 44 is the silicon included organic film composed of a polymer of divinyl-siloxane-benzocyclobutene. The first BCB film 44 has a relative dielectric constant lower than that of a silicon oxide film. The relative dielectric constant of the first BCB film 44 is 2.6.

Further, a Silk film 45 is formed on an upper surface of the first BCB film 44. The Silk film 45 is formed by spin on coating. As will later be described more in detail, the first BCB film 44 positioned under the Silk film 45 functions as an etching stopper, when the Silk film 45 is etched.

Furthermore, a second BCB film 46 and a silicon oxide film 47 are formed one by one on an upper surface of the Silk film 45. The second BCB film 46 is the silicon included organic film composed of a polymer of divinyl-siloxane-benzocyclobutene. As will later be described more in detail, the second BCB film 46 and the silicon oxide film 47 function as hard masks, when the Silk film 45 is etched.

Next, as illustrated in FIG. 5(b), a photo resist 48 is formed on an upper surface of the second BCB film 46. Further, a wiring trench pattern 48a is formed in the photo resist 48 by the use of photolithography technique.

Further, as illustrated in FIG. 5(c), the silicon oxide film 47 is etched using the photo resist 48 as an etching mask to form a pattern 47a. Furthermore, after the etching of the silicon oxide film 47, the photo resist 48 is removed from the upper surface of the silicon oxide film 47 by the use of $N_2/H_2$ plasma.

At this time, the second BCB film 46 has an etching resistance property against $N_2/H_2$ plasma. An etching speed is low, when the second BCB film 46 is etched by using the $N_2/H_2$ plasma. On the other hand, an ashing speed is high, when the photo resist 48 is ashed by using the $N_2/H_2$ plasma. As a result, when the photo resist 48 is removed by the use of $N_2/H_2$ plasma, the second BCB film 46 is never etched.

Moreover, as illustrated in FIG. 6(a), the second BCB film 46 is etched by using N2/O2 plasma with the silicon oxide film 47 being used as a hard mask to form a pattern 46a.

Thereafter, the Silk film 45 is etched by using the N2/H2 plasma with the second BCB film 46 having the pattern 46a thus formed and the silicon oxide film 47 being used as hard masks, as illustrated in FIG. 6(b). As a result, an opening portion 45a is formed in the Silk film 45 down to the first BCB film 44. Herein, since the first BCB film 44 has an etching resistance property against N2/H2 plasma, the etching of the Silk film 45 is stopped by the upper surface of the first BCB film 44.

Further, the first BCB film 44 positioned at the bottom of the opening portion 45a is etched by using the mixed gas of the N2 gas and the O2 gas as the etching gas with the silicon oxide film 47 being used as a hard mask to form a contact reaching the plug 43. Herein, it is desirable that a fluorine gas, such as fluorocarbon, is added to the etching gas, that is, the mixed gas of the N2 gas and the O2 gas. Preferably, a composition (mol) ratio of the fluorine gas among all the etching gas is 0.1 to 5.0 mol %.

Furthermore, not only a Ta/TaN barrier film (not shown) but also a copper thin film for electrode (not shown) are formed by ionization sputtering method. Thereafter, a copper is buried in the contact by plating method in which the copper thin film for electrode (not shown) thus formed is used as an electrode in plating. Further, unnecessary portions of the Ta/TaN barrier film and the copper thin film are removed by the use of the CMP method. As a result, a copper wiring 49 is formed, as illustrated in FIG. 6(c).

In the method of manufacturing a semiconductor device according to the embodiment 2, not only the etching stopper but also the hard mask are formed by the first and the second BCB films each of which is a silicon included organic film having a low dielectric constant. Accordingly, interlayer capacitance can be further reduced in a semiconductor device thus manufactured.

Besides, it is alternatively possible to use a porous organic film in which micropores each having a size of 1 to 10 nanometer are diffused within the film as an organic film of the present invention. By making the organic film of the present invention be porous, etching selectivity of the organic film against a silicon included organic film can be further increased As a result, the structure having such a porous organic film becomes more suitable for the method of manufacturing a semiconductor device of the present invention. In this case, the structure in which the porous organic film is interposed (sandwiched) between the silicon included organic films can be considered.

[Embodiment 3]

Figure 7:
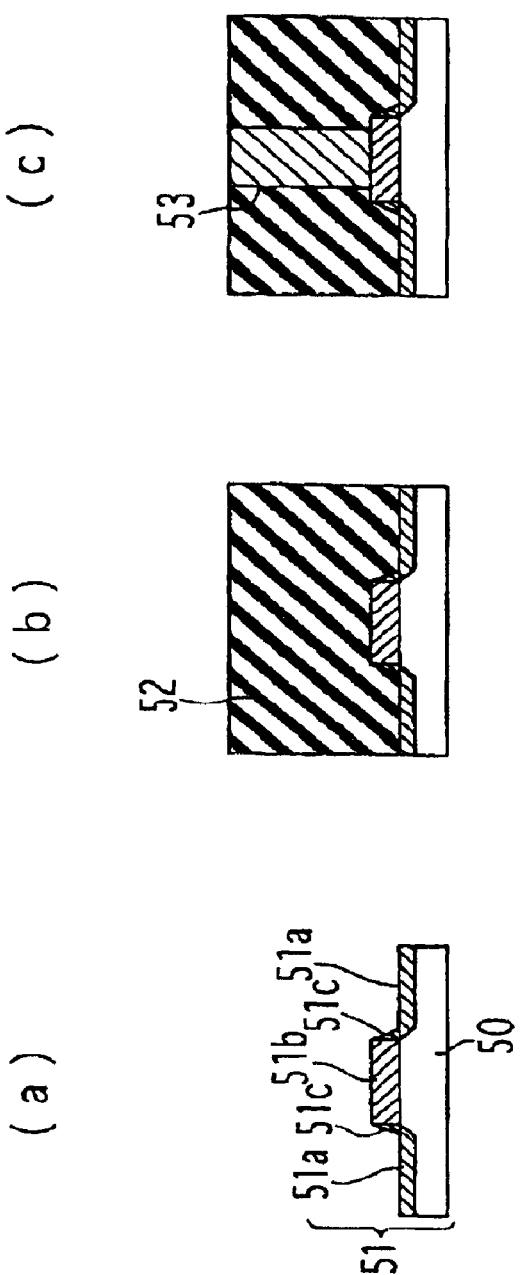
FIG. 7 is a sectional view for schematically showing a method of manufacturing a semiconductor device according to an embodiment 3 of the present invention.
Figure 8:
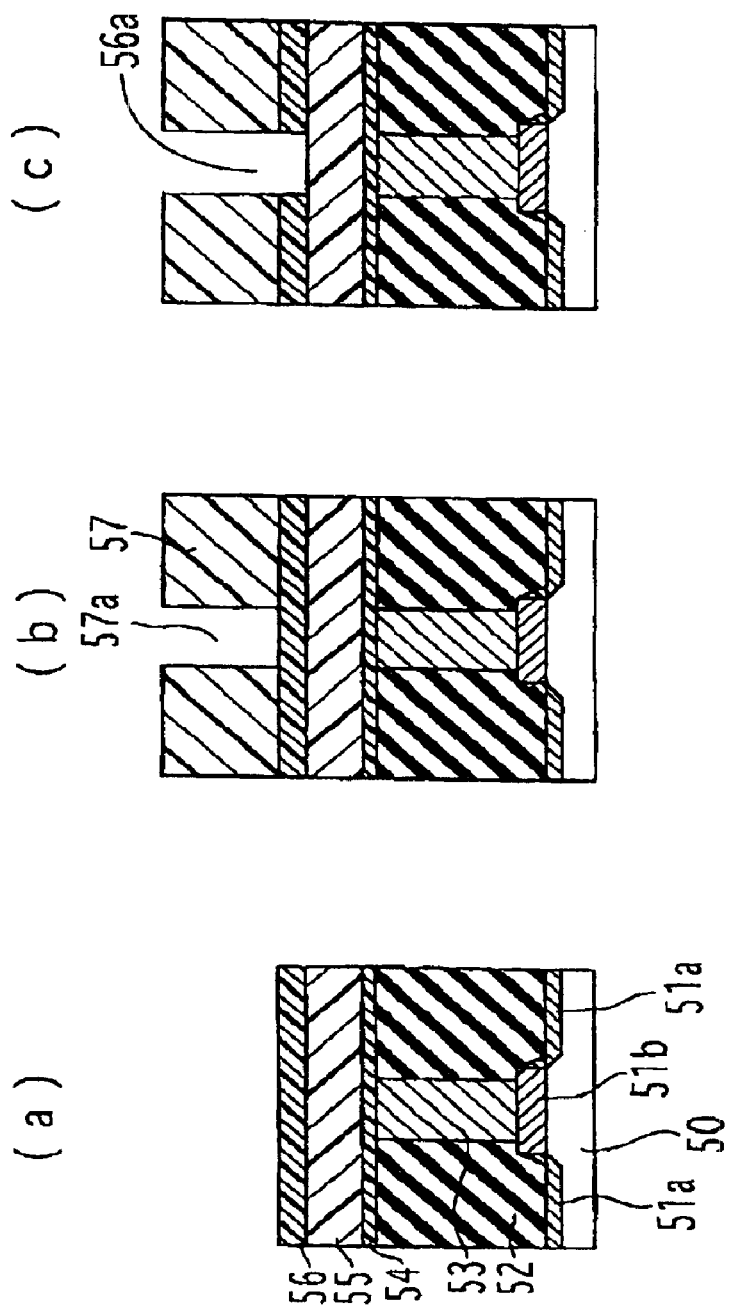
FIG. 8 is a sectional view for schematically showing a method of manufacturing a semiconductor device according to an embodiment 3 of the present invention.
Figure 9:
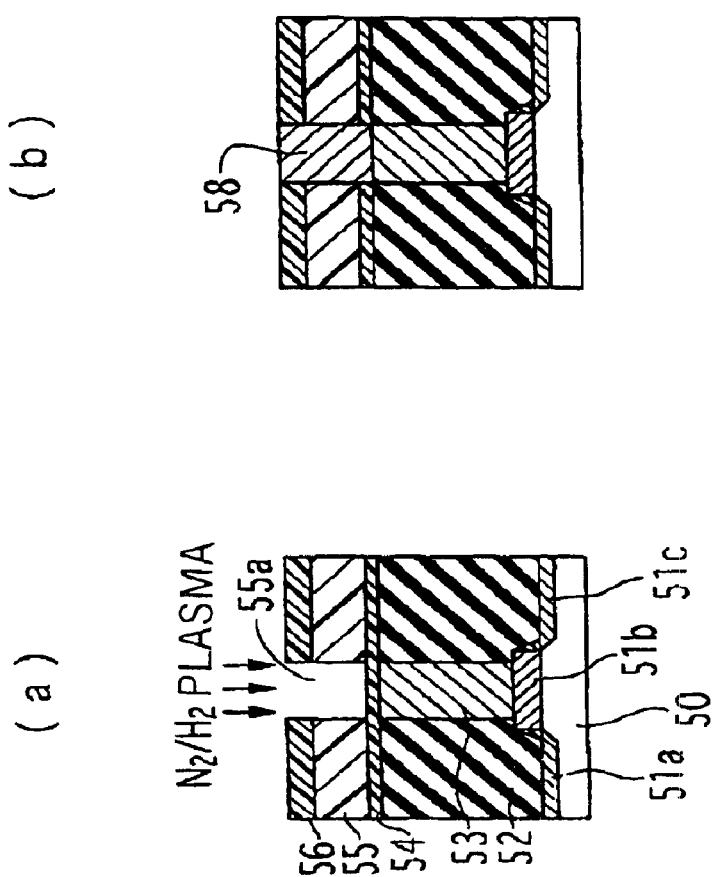
FIG. 9 is a sectional view for schematically showing a method of manufacturing a semiconductor device according to an embodiment 3 of the present invention.

FIGS. 7, 8, and 9 are sectional views for schematically showing a method of manufacturing a semiconductor device according to the embodiment 3 of the present invention. In the embodiment 3, the opening portion is formed in the silicon non-included organic film by using one silicon included organic film as a hard mask and another silicon included organic film as an etching stopper, similarly to the embodiment 2. However, the method of manufacturing a semiconductor device according to the embodiment 3 is different from that of the embodiment 2, as follows.

At first, as illustrated in FIG. 7(a), a MOS (Metal Oxide Semiconductor) transistor 51 is formed on an upper surface of a silicon substrate 50 In particular, source/drain 51a, a gate 51b and sidewalls 51c of which the MOS transistor 51 is composed are formed on the upper surface of the silicon substrate 50.

Next, as illustrated in FIG. 7(b), as an interlayer insulating film, a silicon oxide film 52 is formed thereon, so that the MOS transistor 51 is overlaid by the silicon oxide film 52. Further, as illustrated in FIG. 7(c), a plug 53 which is connected to the source/drain 51a of the MOS transistor 51 is formed through the silicon oxide film 52. The plug 53 is formed by the use of a conductive plug, such as a tungsten plug.

Thereafter, as illustrated in FIG. 8(a), a first BCB film 54 is formed on the silicon oxide film 52 and the plug 53, so that the silicon oxide film 52 and the plug 53 are overlaid by the first BCB film 54. The first BCB film 54 is the silicon included organic film composed of a polymer of divinyl-siloxane-benzocyclobutene. The first BCB film 54 has a relative dielectric constant lower than that of a silicon oxide film. The relative dielectric constant of the first BCB film 54 is 2.6.

Further, a Silk film 55 is formed on an upper surface of the first BCB film 54. The Silk film 55 is formed by spin on coating. As will later be described more in detail, the first BCB film 54 positioned under the Silk film 55 functions as an etching stopper, when the Silk film 55 is etched.

Furthermore, a second BCB film 56 is formed on an upper surface of the Silk film 55. The second BCB film 56 is the silicon included organic film composed of a polymer of divinyl-siloxane-benzocyclobutene, similarly to the first BCB film 54. The second BCB film 56 is formed to be larger in thickness than the first BCB film 54.

Next, as illustrated in FIG. 8(b), a photo resist 57 is formed on an upper surface of the second BCB film 56. Further, an opening trench 57a is formed in the photo resist 57 by the use of photolithography technique.

Further, as illustrated in FIG. 8(c), the second BCB film 56 is etched by using N2/O2 plasma with the photo resist 57 being used as an etching mask to form a pattern 56a.

Furthermore, after the etching of the second BCB film 56, an etching of the Silk film 55 as well as remove of the photo resist 57 from the upper surface of the second BCB film 56 are carried out at the same time by the use of N2/H2 plasma, as illustrated in FIG. 9(a). An opening portion 55a is formed in the Silk film 55. Since both the Silk film 55 and the photo resist 57 are silicon non-included organic films, etching speeds during the etchings by the N2/H2 plasma are high. On the contrary, when the first BCB film 54 and the second BCB film 56 are etched by the N2/H2 plasma, etching speeds during the etchings by the N2/H2 plasma are very low. Therefore, the etching of the photo resist 57 by the N2/H2 plasma is stopped by the upper surface of the second BCB film 56. In addition, the etching of the Silk film 55 by the N2/H2 plasma is stopped by the upper surface of the first BCB film 54. Accordingly, it is possible to form the opening portion 55a in the Silk film 55 and remove (peel off) the photo resist 57 at the same time.

Further, the first BCB film 54 positioned at the bottom of the opening portion 55a is etched by N2/O2 plasma with the second BCB film 56 being used as a hard mask to form a contact reaching the plug 53. At this time, when the first BCB film 54 is etched by the N2/O2 plasma, also the second BCB film 56 is etched by the N2/O2 plasma. It is therefore desirable that the second BCB film 56 is formed to be larger in thickness than the first BCB film 54.

Furthermore, not only a Ta/TaN barrier film (not shown) but also a copper thin film for electrode (not shown) are formed by ionization sputtering method. Thereafter, a copper is buried in the contact by plating method in which the copper thin film for electrode (not shown) thus formed is used as an electrode in plating. Further, unnecessary portions of the Ta/TaN barrier film and the copper thin film are removed by the use of the CMP method. As a result, a copper wiring 58 is formed, as illustrated in FIG. 9(b).

As mentioned before, the dual hard mask in which a BCB film and a silicon oxide fin are stacked is used in the method of manufacturing a semiconductor device according to the embodiment 2. On the contrary, such a dual hard mask is not used in the method of manufacturing a semiconductor device according to the embodiment 3. Namely, in the method of manufacturing a semiconductor device according to the embodiment 3, the second BCB film 56 having a dielectric constant lower than that of a silicon oxide film is solely used as a hard mask. Accordingly, interlayer capacitance can be further reduced in a semiconductor device thus manufactured.

Besides, it is alternatively possible to use a porous organic film in which micropores each having a size of 1 to 10 nanometer are diffused within the film as an organic film of the present invention. By making the organic film of the present invention be porous, etching selectivity of the organic film against a silicon included organic film can be further increased. As a result, the structure having such a porous organic fin becomes more suitable for the method of manufacturing a semiconductor device of the present invention. In this case, the structure in which the porous organic film is interposed (sandwiched) between the silicon included organic films can be considered.

In the methods of manufacturing semiconductor devices according to the embodiments 1 through 3 mentioned above, a copper wiring is formed by the use of the methods. However, via can be formed similarly by the use of the methods according to the embodiments 1 through 3.

[Embodiment 4]

Figure 10:
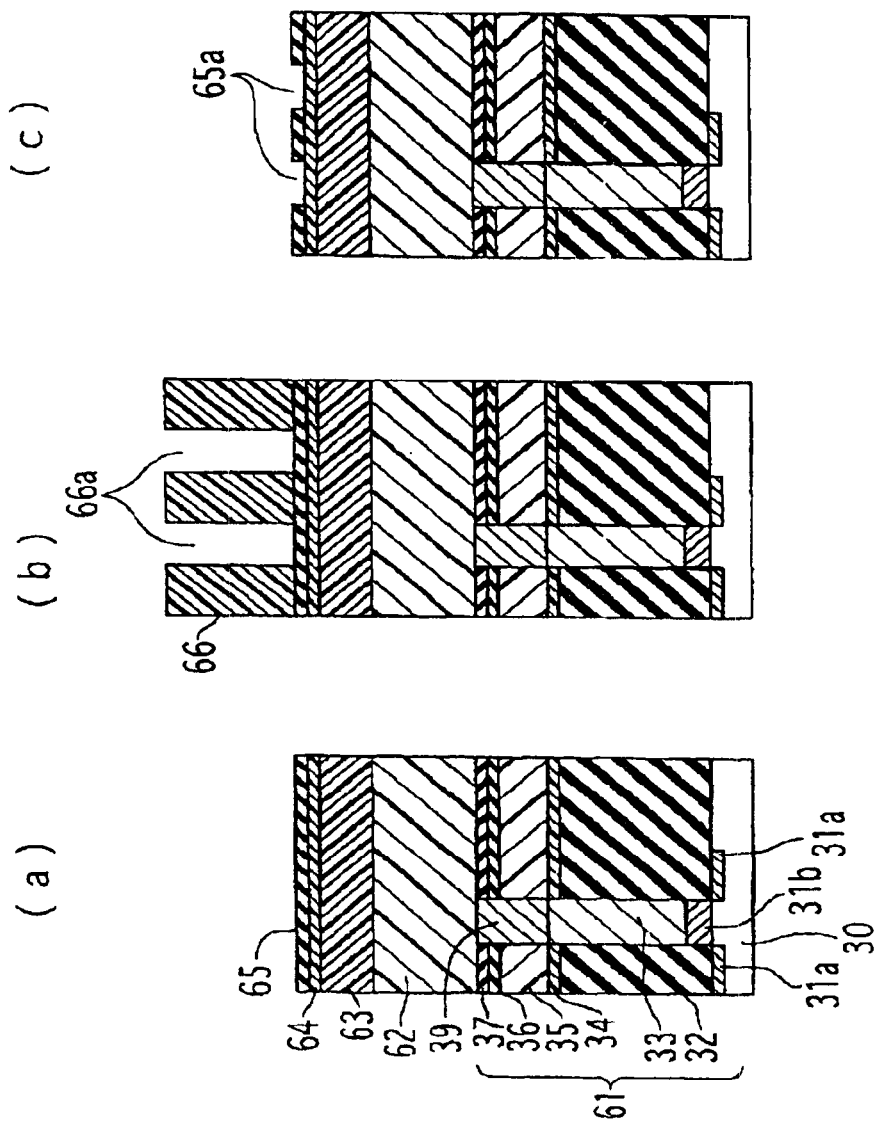
FIG. 10 is a sectional view for schematically showing a method of manufacturing a semiconductor device according to an embodiment 4 of the present invention.
Figure 11:
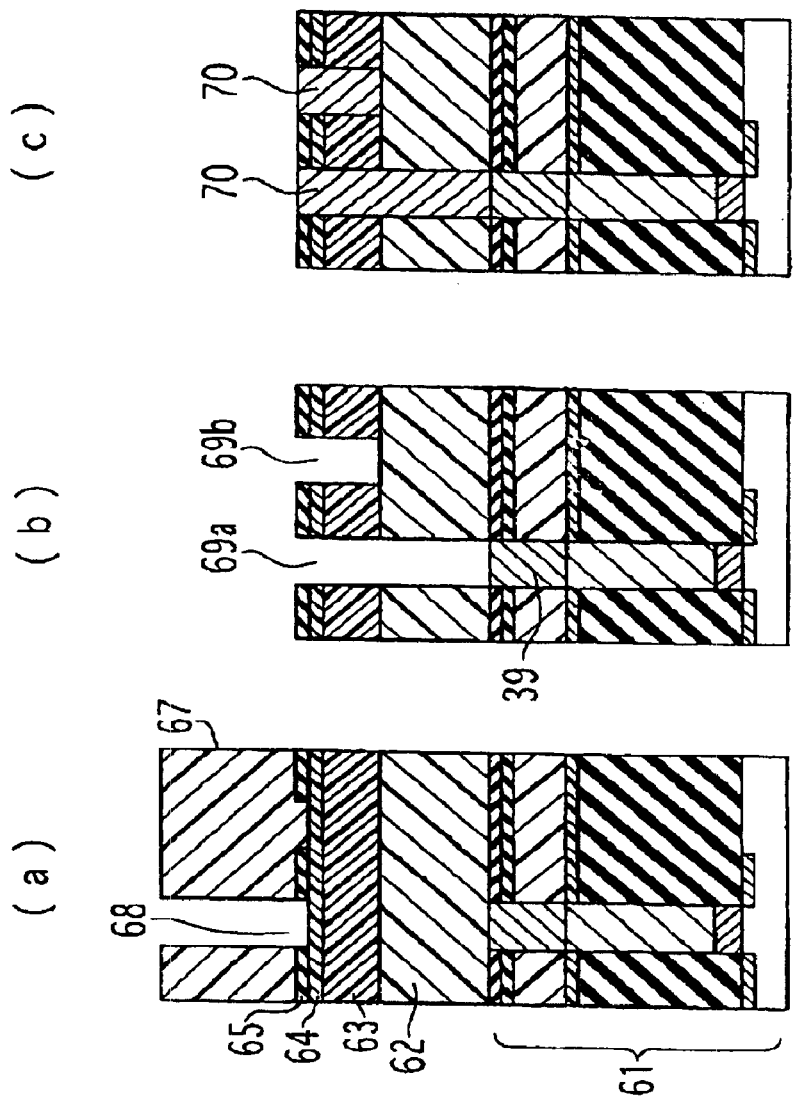
FIG. 11 is a sectional view for schematically showing a method of manufacturing a semiconductor device according to an embodiment 4 of the present invention.

FIGS. 10 and 11 are sectional views for schematically showing a method of manufacturing a semiconductor device according to the embodiment 4 of the present invention.

At first, as illustrated in FIG. 10(*a*), a lower wiring structure 61 is formed on an upper surface of a silicon substrate 30. The lower wiring structure 61 includes a MOS (Metal Oxide Semiconductor) transistor 31, a silicon oxide film 32, a plug 33, a BCB film 34, a Silk film 35, a silicon nitride film 36, a silicon oxide film 37, and a copper wiring 39. These elements included in the lower wiring structure 61 are formed similarly to those of the semiconductor device in the above-mentioned method of manufacturing a semiconductor device according to the embodiment 1.

Next, as illustrated in FIG. 10(*a*), a BCB film 62 is formed on an upper surface of the lower wiring structure 61. Further, a Silk film 63 is formed on an upper surface of the BCB fin 62. Further, a BCB film 64 and a silicon oxide film 65 are formed one by one on an upper surface of the Silk film 63. As will later be described more in detail, the BCB film 64 and the silicon oxide film 65 function as a dual hard mask, when the Silk film 63 is etched.

Thereafter, as illustrated in FIG. 10(*b*), a photo resist 66 is formed on an upper surface of the silicon oxide film 65. Further, a resist pattern 66*a* for forming a wring trench is formed in the photo resist 66 by the use of photolithography technique.

Further, as illustrated in FIG. 10(*c*), the silicon oxide film 65 is etched by using fluorine plasma with the photo resist 66 being used as an etching mask to form a wiring trench pattern 65*a*. Furthermore, the photo resist 66 is removed (peeled off) by using N2/H2 plasma. At this time, the BCB film 64 is exposed in the bottom portion of the wiring trench pattern 65*a* of the silicon oxide film 65. However, the BCB film 64 has an etching resistance property against N2/H2 plasma. Accordingly, the BCB film 64 is not etched, when the photo resist 66 is removed (peeled off) by using the N2/H2 plasma.

Thereafter, as illustrated in FIG. 11(*a*), a photo resist 67 is formed on an upper surface of the silicon oxide film 65. Further, a resist pattern 68 for opening a via is formed in the photo resist 67 by the use of photolithography technique.

Further, as illustrated in FIG. 11(*b*), a via opening 69*a* reaching the copper wiring 39 and a wiring trench 69*b* are formed. In particular, the via opening 69*a* and the wiring trench 69*b* are formed as follows. After the resist pattern 68 for opening a via is formed in the photo resist 67, at first, the silicon oxide film 65 is etched by using fluorine gas as an etching gas with the photo resist 67 being used as an etching mask. The etching gas is then changed into a mixed gas of nitrogen gas and oxygen gas. Thereby, the BCB film 64 existing at the bottom of the resist pattern 68, the Silk film 63, and the BCB film 62 are etched one by one to form the via opening 69*a*. At this time, the silicon oxide film 65 existing as the uppest layer is not etched by the N2/O2 plasma. As a result, a shift of size of the via opening 69*a* is not so generated.

Thereafter, the etching gas is then changed into a mixed gas of nitrogen gas and hydrogen gas, so that the photo resist 67 is completely removed. Further, the BCB film 64 existing at the bottom of the resist pattern 68 is removed by the N2/O2 plasma. Thereafter, the Silk film 63 is etched by the N2/H2 plasma with the BCB film 64 and the silicon oxide film 65 being used as a dual hard mask to form the wiring trench 69*b*. At that time, the BCB film 62 which appears on the bottom of the wiring trench 69*b* functions as an etching stopper.

Furthermore, as illustrated in FIG. 11(*c*), copper is buried into both the via opening 69*a* and the wiring trench 69*b* to form copper wirings 70.

In the method of manufacturing a semiconductor device according to the embodiment 4, an etching stopper having a high relative dielectric constant, such as a silicon nitride film, a silicon oxide film, and a silicon carbide film is not used. Accordingly, interlayer capacitance can be greatly reduced in a semiconductor device thus manufactured.

Besides, it is alternatively possible to use a porous organic film in which micropores each having a size of 1 to 10 nanometer are diffused within the film as an organic film of the present invention. By making the organic film of the present invention be porous, etching selectivity of the organic film against a silicon included organic film can be further increased. As a result, the structure having such a porous organic film becomes more suitable for the method of manufacturing a semiconductor device of the present invention. In this case, the structure in which the porous organic film is interposed (sandwiched) between the silicon included organic films can be considered.

[Embodiment 5]

Figure 12:
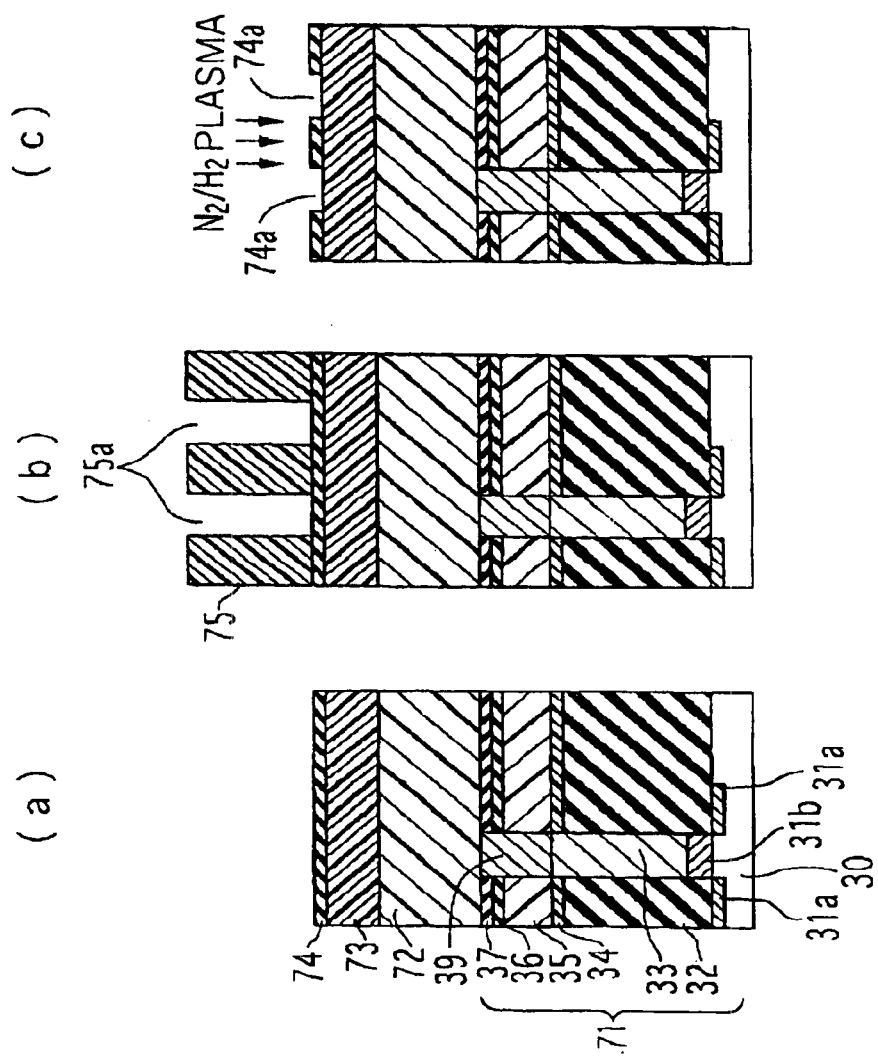
FIG. 12 is a sectional view for schematically showing a method of manufacturing a semiconductor device according to an embodiment 5 of the present invention.
Figure 13:
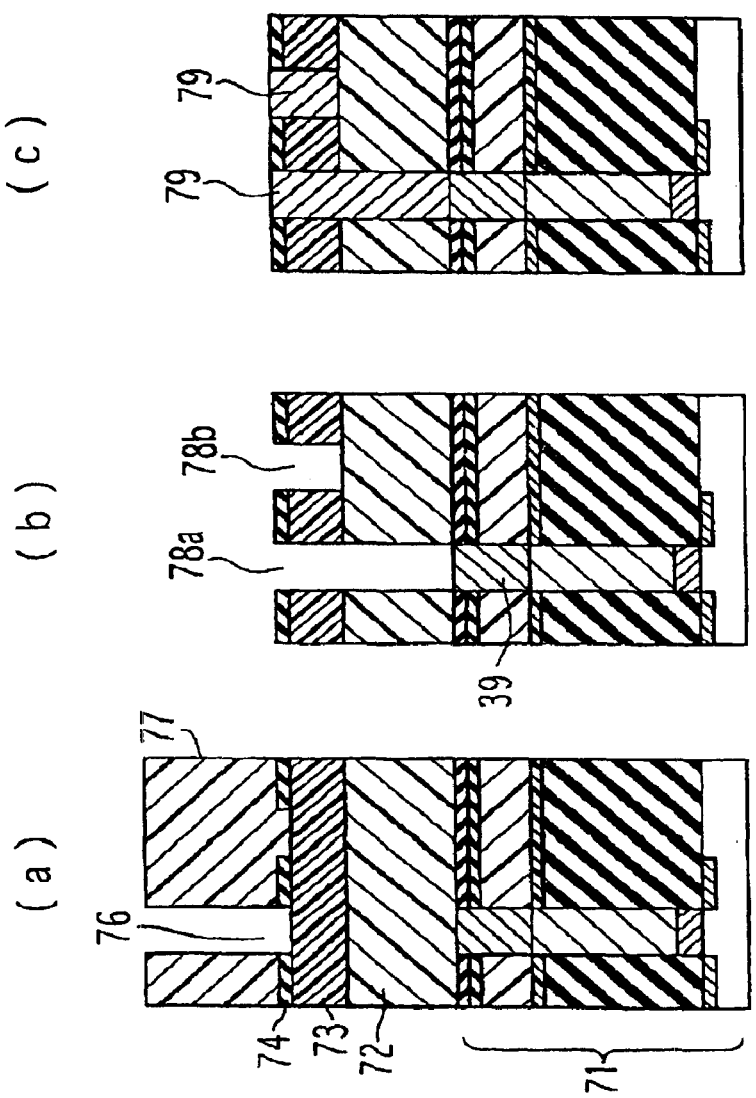
FIG. 13 is a sectional view for schematically showing a method of manufacturing a semiconductor device according to an embodiment 5 of the present invention.

FIGS. 12 and 13 are sectional views for schematically showing a method of manufacturing a semiconductor device according to the embodiment 5 of the present invention.

At first, as illustrated in FIG. 12(*a*), a lower wiring structure 71 is formed on an upper surface of a silicon substrate 30. The lower wiring structure 71 includes a MOS (Metal Oxide Semiconductor) transistor 31, a silicon oxide film 32, a plug 33, a BCB film 34, a Silk film 35, a silicon nitride film 36, a silicon oxide film 37, and a copper wiring 39. These elements included in the lower wiring structure 71 are formed similarly to those of the semiconductor device in the above-mentioned method of manufacturing a semiconductor device according to the embodiment 1.

Next, as illustrated in FIG. 12(*a*), a Silk film 72 is formed on an upper surface of the lower wiring structure 71 by spin coating method. Further, a BCB film 73, that is a silicon included organic film having a low dielectric constant, is formed on an upper surface of the Silk film 72. Further, a silicon oxide film 74 is formed on an upper surface of the BCB film 73, so that the BCB film 73 may be overlaid by the silicon oxide film 74. As will later be described more in detail, the silicon oxide film 74 functions as a hard mask, when the BCB film 73 is etched.

Thereafter, as illustrated in FIG. 12(b), a photo resist 75 is formed on an upper surface of the silicon oxide film 74. Further, a resist pattern 75a for forming a wiring trench is formed in the photo resist 75 by the use of photolithography technique.

Further, as illustrated in FIG. 12(c), the silicon oxide film 74 is etched by using fluorine plasma with the photo resist 75 being used as an etching mask to form a wiring trench pattern 74a. Furthermore, the photo resist 75 is removed (peeled off) by using N2/H2 plasma. At this time, the BGB film 73 is exposed to the N2/H2 plasma in the bottom portion of the wiring trench pattern 74a of the silicon oxide film 74. However, the BCB film 73 has an etching resistance property against N2/H2 plasma. Accordingly, the BCB film 73 is not etched, when the photo resist 75 is removed (peeled off) by using the N2/H2 plasma.

Thereafter, as illustrated in FIG. 13(a), a photo resist 77 is formed on an upper surface of the silicon oxide film 74. Further, a resist pattern 76 for opening a via is formed in the photo resist 77 by the use of photolithography technique.

Further, as illustrated in FIG. 13(b), a via opening 78a reaching the copper wiring 39 and a wiring trench 78b are formed. In particular, the via opening 78a and the wiring trench 78b are formed as follows. After the resist pattern 76 for opening a via is formed in the photo resist 77, at first, the BCB film 73 is etched by using N2/O2 plasma, namely a mixed gas of nitrogen gas and oxygen gas as an etching gas, with the photo resist 77 being used as an etching mask. The etching gas is then changed into a mixed gas of nitrogen gas and hydrogen gas. Thereby, the Silk film 72 is etched by the N2/H2 plasma to form the via opening 78a reaching the copper wiring 39.

When the Silk film 72 is etched by the N2/H2 plasma, the photo resist 77 is removed (peeled off) at the same time. After the etching of the Silk film 72 and the remove (peeling off) of the photo resist 77 are carried out by using the N2/H2 plasma, the BCB film 73 is etched by using N2/O2 plasma with the silicon oxide film 74 being used as a mask to form the wiring trench 78b.

Furthermore, as illustrated in FIG. 13(c), copper is buried into both the via opening 78a and the wiring trench 78b to form copper wirings 79.

In the method of manufacturing a semiconductor device according to the embodiment 5, an etching stopper having a high relative dielectric constant, such as a silicon nitride film, a silicon oxide film, and a silicon carbide film is not used. Accordingly, similarly to the above-mentioned embodiment 4, interlayer capacitance can be greatly reduced in a semiconductor device thus manufactured.

[Embodiment 6]

Figure 14:
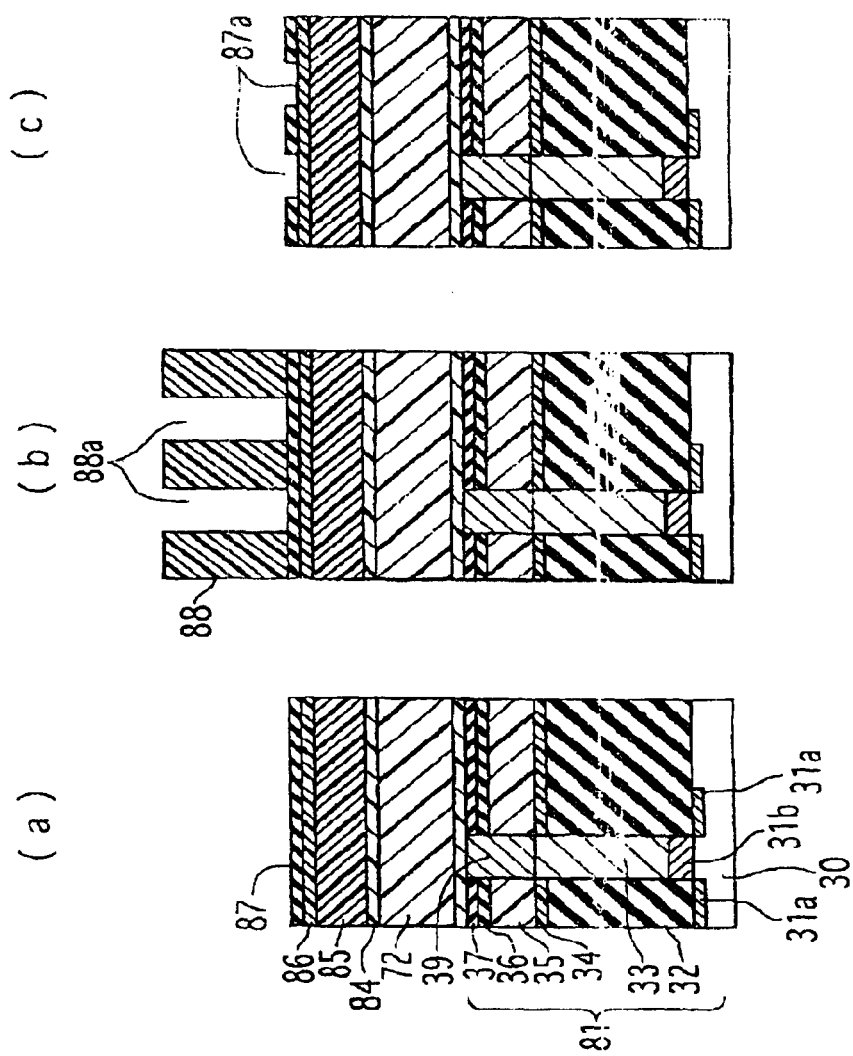
FIG. 14 is a sectional view for schematically showing a method of manufacturing a semiconductor device according to an embodiment 6 of the present invention.
Figure 15:
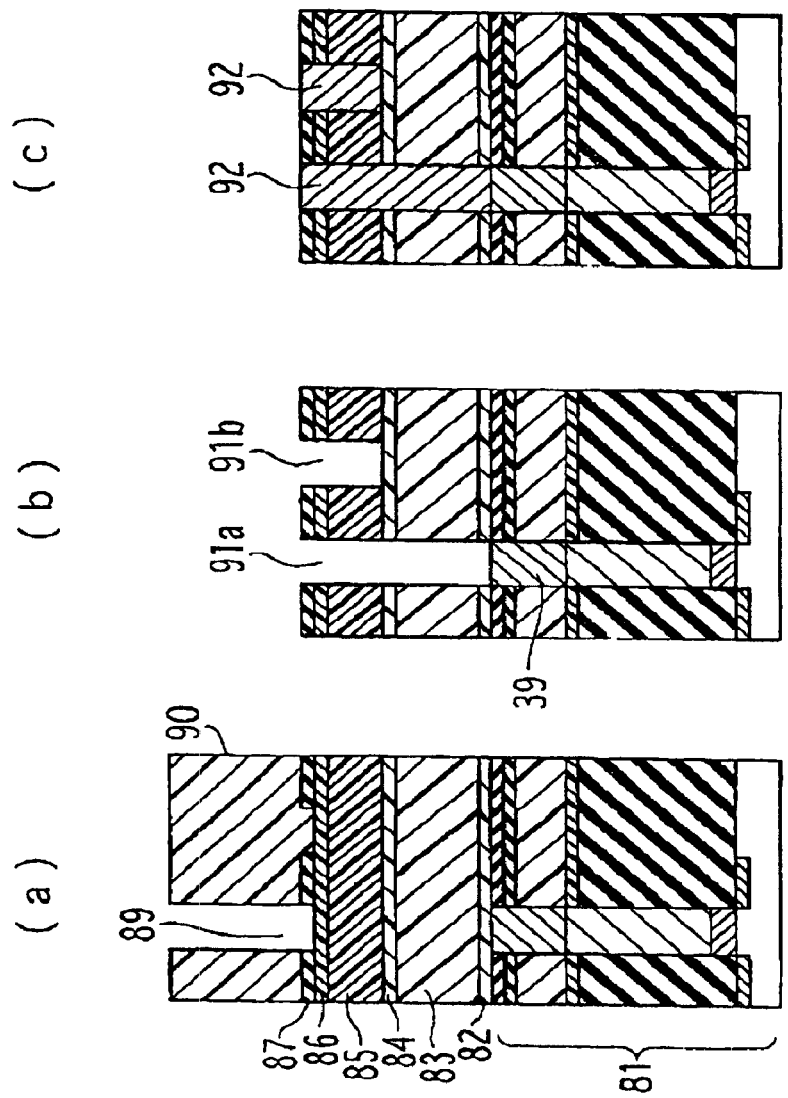
FIG. 15 is a sectional view for schematically showing a method of manufacturing a semiconductor device according to an embodiment 6 of the present invention.

FIGS. 14 and 15 are sectional views for schematically showing a method of manufacturing a semiconductor device according to the embodiment 6 of the present invention.

At first, as illustrated in FIG. 14(a), a lower wiring structure 81 is formed on an upper surface of a silicon substrate 30. The lower wiring structure 81 includes a MOS (Metal Oxide Semiconductor) transistor 31, a silicon oxide film 32, a plug 33, a BCB film 34, a Silk film 35, a silicon nitride film 36, a silicon oxide film 37, and a copper wiring 39. These elements included in the lower wiring structure 81 are formed similarly to those of the semiconductor device in the above-mentioned method of manufacturing a semiconductor device according to the embodiment 1.

Next, as illustrated in FIG. 14(a), a cap BCB film 82 is formed on an upper surface of the lower wiring structure 81. The cap BCB film 82 is formed by a BCB film that is a silicon included organic film. Further, a Silk film 83 is formed on an upper surface of the cap BCB film 82 by spin coating method. Further, a BCB film 84 is formed on an upper surface of the Silk film 83. Further, a Silk film 85 is formed on an upper surface of the BCB film 84. As will later be described more in detail, the BOB film 84, which is positioned under the Silk film 85, functions as an etching stopper, when the Silk film 85 is etched. Further, a BCB film 86 and a silicon oxide film 87 are formed one by one on an upper surface of the Silk film 85. As will later be described more in detail, the BCB film 86 and the silicon oxide film 87 function as a dual hard mask, when the Silk film 85 is etched.

Thereafter, as illustrated in FIG. 14(b), a photo resist 88 is formed on an upper surface of the silicon oxide film 87. Further, a resist pattern 88a for forming a wiring trench is formed in the photo resist 88 by the use of photolithography technique.

Further, as illustrated in FIG. 14(c), the silicon oxide film 87 is etched by using fluorine plasma with the photo resist 88 being used as an etching mask to form a wiring trench pattern 87a. Furthermore, the photo resist 88 is removed (peeled off) by using N2/H2 plasma. At this time, the BCB film 86 is exposed to the N2/H2 plasma in the bottom portion of the wiring trench pattern 87a of the silicon oxide film 87. However, the BOB film 86 has an etching resistance property against N2/H2 plasma. Accordingly, the BCB film 86 is not etched, when the photo resist 88 is removed (peeled off) by using the N2/H2 plasma. As a result, the Silk film 85 positioned under the BCB film 86 is also not etched.

Thereafter, as illustrated in FIG. 15(a), a photo resist 90 is formed on an upper surface of the silicon oxide film 87. Further, a resist pattern 89 for opening a via is formed in the photo resist 90 by the use of photolithography technique.

Further, as illustrated in FIG. 15(b), a via opening 91a reaching the copper wiring 39 and a wiring trench 91b are formed. In particular, the via opening 91a and the wiring trench 91b are formed as follows. After the resist pattern 89 for opening a via is formed in the photo resist 90, at first, the BCB film 86, the Silk film 85, and the BCB film 84 are etched one by one by using N2/O2 plasma, namely a mixed gas of nitrogen gas and oxygen gas as an etching gas, with the photo resist 90 being used as an etching mask. In the etchings of the BCB film 86, the Silk film 85, and the BCB film 84 conducted one by one, the photo resist 88 has already been removed (peeled off), when the etching of the BCB film 84 comes to be completed. Further, the Silk film 83 is etched by the N2/H2 plasma. The etching of the Silk film 83 is stopped by the upper surface of the cap BOB film 82. By such sequential etchings, an opening portion penetrating the BCB film 86, the Silk film 85, the BCB film 84 and the Silk film 83 and reaching the cap BCB film 82 is formed, as illustrated in FIG. 15(b).

The etching gas is then changed into a mixed gas of nitrogen gas and oxygen gas. Thereby, the cap BCB film 82 positioned at the bottom of the opening portion mentioned above is removed by the N2/O2 plasma to form the via opening 91a. At the same time, the BCB film 86 positioned under the wiring trench pattern 87a formed in the silicon oxide film 87 is also removed. The etching gas is then changed again into a mixed gas of nitrogen gas and hydrogen gas. Thereby, the wiring trench 91b is formed in the Silk film 85.

Furthermore, as illustrated in FIG. 15(c), copper is buried into both the via opening 91a and the wiring trench 91b to form copper wirings 92.

In the method of manufacturing a semiconductor device according to the embodiment 6, an etching stopper having a high relative dielectric constant, such as a silicon nitride film, a silicon oxide film, and a silicon carbide film is not used. Accordingly, similarly to the above-mentioned embodiments 4 and 5, interlayer capacitance can be greatly reduced in a semiconductor device thus manufactured.

Besides, it is alternatively possible to use a porous organic film in which micropores each having a size of 1 to 10 nanometer are diffused within the film as an organic film of the present invention. By making the organic film of the present invention be porous, etching selectivity of the organic film against a silicon included organic film can be further increased. As a result, the structure having such a porous organic film becomes more suitable for the method of manufacturing a semiconductor device of the present invention. In this case, the structure in which the porous organic film is interposed (sandwiched) between the silicon included organic films can be considered.

[Embodiment 7]

Figure 16:
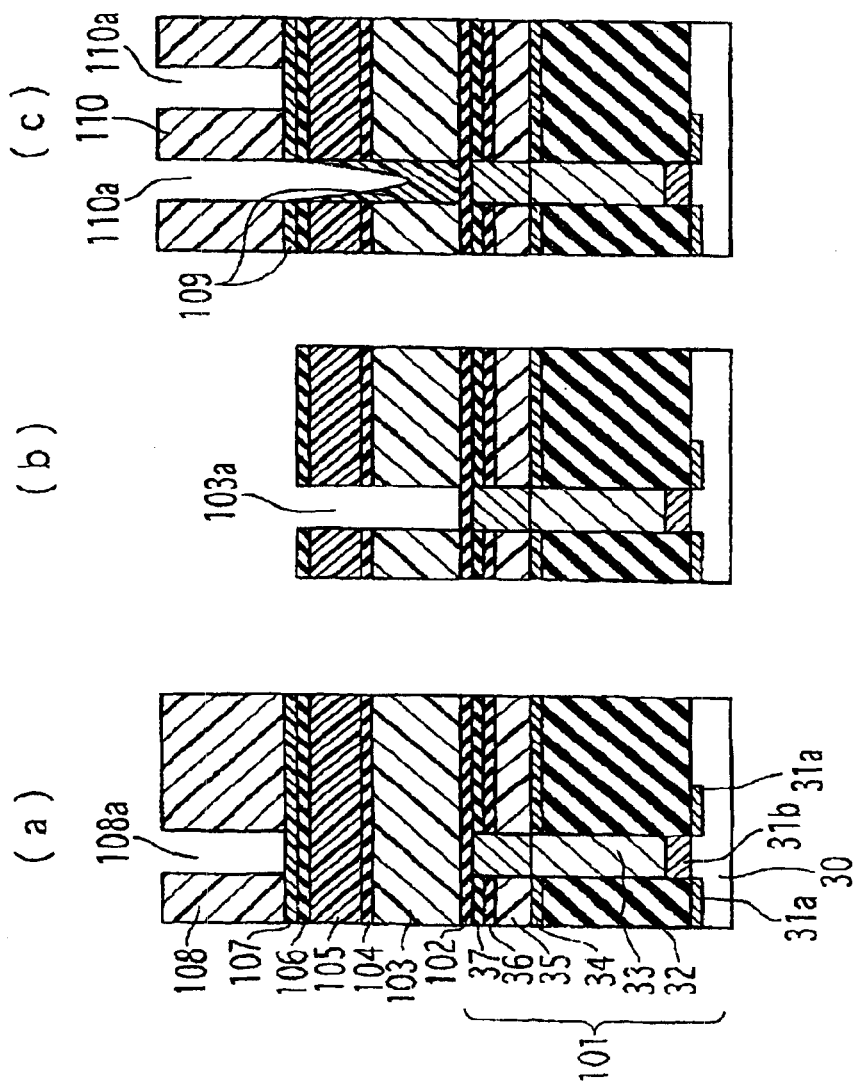
FIG. 16 is a sectional view for schematically showing a method of manufacturing a semiconductor device according to an embodiment 7 of the present invention.
Figure 17:
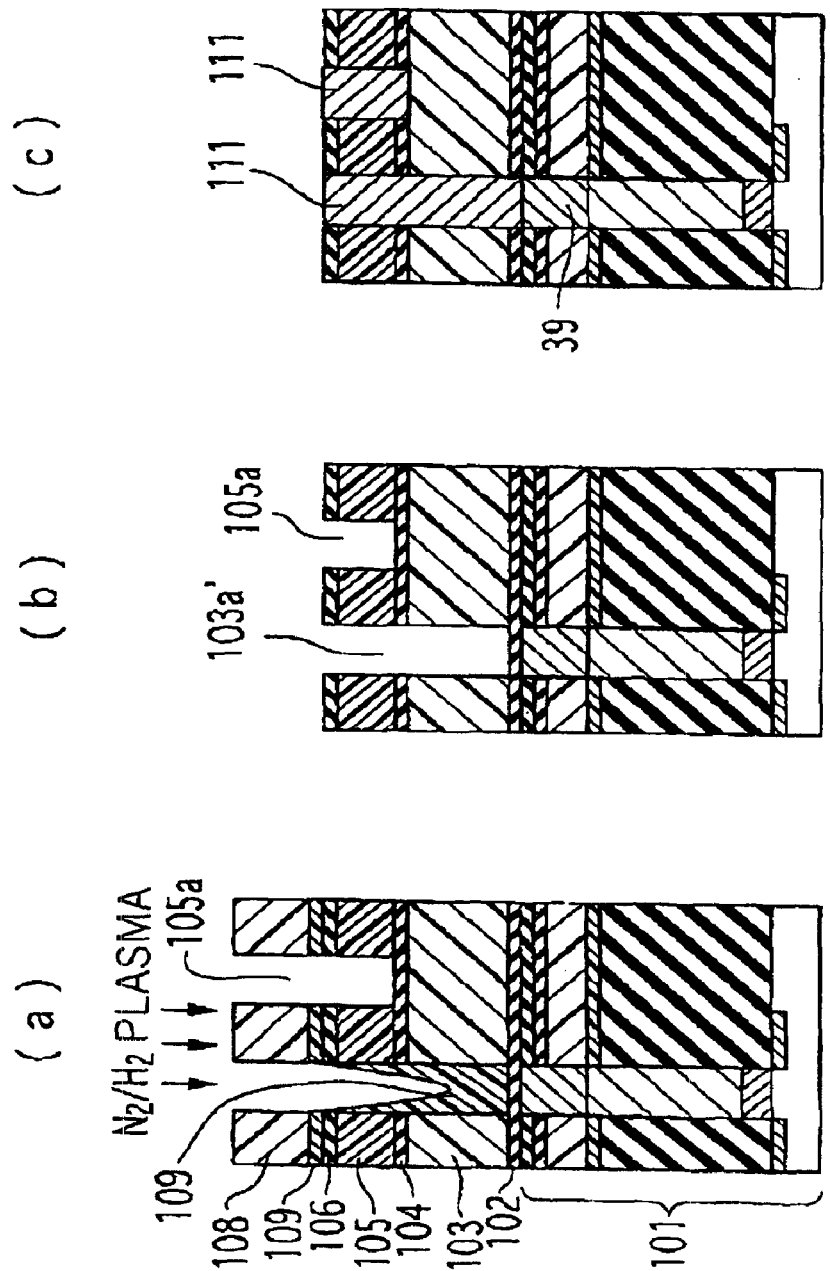
FIG. 17 is a sectional view for schematically showing a method of manufacturing a semiconductor device according to an embodiment 7 of the present invention.

FIGS. 16 and 17 are sectional views for schematically showing a method of manufacturing a semiconductor device according to the embodiment 7 of the present invention.

At first, as illustrated in FIG. 16(a), a lower wiring structure 101 is formed on an upper surface of a silicon substrate 30. The lower wiring structure 101 includes a MOS (Metal Oxide Semiconductor) transistor 31, a silicon oxide film 32, a plug 33, a BCB film 34, a Silk film 35, a silicon nitride film 36, a silicon oxide film 37, and a copper wiring 39. These elements included in the lower wiring structure 101 are formed similarly to those of the semiconductor device in the above-mentioned method of manufacturing a semiconductor device according to the embodiment 1.

Next, as illustrated in FIG. 16(a), a silicon nitride film 102 that is a thin film having a thickness of approximately 25 nanometers is formed as a cap film on an upper surface of the lower wiring structure 101. Since the silicon nitride film 102 is formed as a thin film, an effective relative dielectric constant can be prevented from being increased. A BCB film 103 is formed on an upper surface of the silicon nitride film 102. Further, a silicon nitride film 104 that is a thin film having a thickness of approximately 20 nanometers is formed on an upper surface of the BCB film 103. Further, the BCB film 105 is formed on an upper surface of the silicon nitride film 104. As will later be described more in detail, the silicon nitride film 104, which is positioned under the BCB film 105, functions as an etching stopper, when the BCB film 105 is etched.

Further, a silicon oxide film 106 is formed on an upper surface of the BCB film 105. As will later be described more in detail, the silicon oxide film 106 functions as a hard mask, when the BCB film 105 is etched. Further, a reflection preventing film 107 is formed by being applied on an upper surface of the silicon oxide film 106.

A photo resist 108 is formed on an upper surface of the reflection preventing film 107. Further, a resist pattern 108a for opening a via is formed in the photo resist 108 by the use of photolithography technique.

Thereafter, as illustrated in FIG. 16(b), the reflection preventing film 107, the silicon oxide film 106, the BCB film 105, the silicon nitride film 104, and the BCB film 103 are etched one by one by using a mixed gas of nitrogen gas, oxygen gas and fluorine gas as an etching gas with the photo resist 108 being used as an etching mask to form a pattern 103a for opening a via. The etching at this time is stopped by the silicon nitride film 102. Furthermore, the reflection preventing film 107 as well as the photo resist 108 are removed (peeled off) by using N2/H2 plasma. At this time, all of the BOB film 103, the BCB film 105, the silicon nitride film 102 and the silicon nitride film 104 are not etched by the N2/H2 plasma. A shift, of size of the pattern 103a for opening a via is not easily generated.

Thereafter, as illustrated in FIG. 16(c), a reflection preventing film 109 is formed by being applied on an upper surface of the silicon oxide film 106. At this time, the reflection preventing film 109 thus applied is much buried into the pattern 103a for opening a via. A photo resist 110 is then formed on an upper surface of the reflection preventing film 109. Further, a resist pattern 110a for forming a wiring trench is formed in the photo resist 110 by the use of photolithography technique.

Thereafter, as illustrated in FIG. 17(a), the reflection preventing film 109 and the BCB film 105 are etched one by one by using a mixed gas of nitrogen gas, oxygen gas and fluorine gas as an etching gas with the photo resist 110 being used as an etching mask to form a wiring trench 105a. At this time, the etching of the BCB film 105 is automatically stopped by the silicon nitride film 104.

Thereafter, as illustrated in FIG. 17(b), the remaining reflection preventing film 109 and the remaining photo resist 108 are ashed by the N2/H2 plasma. At this time, the BCB film 103 and the BCB film 105 are not etched by the N2/H2 plasma. Therefore, a sufficient over etching can be carried out, when the reflection preventing film 109 and the photo resist 108 are ashed. Thus, the reflection preventing film 109 and the photo resist 108 are sufficiently ashed by the N2/H2 plasma to open the above-mentioned pattern 103a for opening a via again.

Thereafter, the silicon nitride film 102 positioned at the bottom of the pattern 103a for opening a via and the silicon nitride film 104 positioned at the bottom of the wiring trench 105a are removed by etch back. Thereafter, a copper seed film having a thickness of approximately 100 nanometers is grown by ionization sputtering method. Further, a copper film is grown by MOCVD method. As a result, the copper film is buried into both the wiring trench 105a and the pattern 103a for opening a via. At this time. Ta/TaN barrier film is not grown. This is because the BCB film itself has a barrier characteristic for preventing the copper from being diffused. Thereafter, annealing is carried out at a temperature from 350° C. to 400° C. As a result, among the copper films, a copper film existing within the pattern 103a for opening a via is epitaxially grown by succeeding to crystal orientation of the copper wiring 39 in the lower wiring structure 101. The copper film existing within the pattern 103a for opening a via is coupled to the copper wiring 39 and rendered to be substantially single crystal. A copper via of single crystal thus formed has a electric resistance lower by 50% or more than a general via resistance. The copper via of single crystal thus formed has an electromigration resistance that is not lower than ten times as high as that of a general via.

In the method of manufacturing a semiconductor device according to the embodiment 7, the reflection preventing film 109 much buried within the pattern 103a for opening a via can be sufficiently ashed. The method of manufacturing a semiconductor device according to the embodiment 7 is particularly effective in a case that a reflection preventing film is used for making wirings be fine in manufacturing processes of a semiconductor device in which via is formed prior to wiring trench.

As described above, in the present invention, it becomes possible to provide the technique for etching a plurality of (multi-layer of) organic films at a high selectivity.

Further, in the present invention, it becomes possible to manufacture a semiconductor device with a reduced interlayer capacitance.

Moreover, in the present invention, it becomes possible to improve the freedom of designing manufacturing processes of a semiconductor device.

What is claimed is:

1. A semiconductor device, comprising:
   a semiconductor substrate;
   an organic film having low dielectric constant and including no silicon, said organic film being formed on said semiconductor substrate; and
   at least two silicon included organic films formed on lower and upper surfaces of said organic film having low dielectric constant, wherein a first silicon included organic film is formed on said lower surface facing said semiconductor substrate and a second silicon included organic film is formed on said upper surface, and wherein said second silicon included organic film is larger in thickness than said first silicon included organic film.

2. A semiconductor device as claimed in claim 1, wherein a conductive film is selectively buried into an opening portion of stacked films consisting of said silicon included organic films formed on said lower and upper surfaces of said organic film having low dielectric constant.

3. A semiconductor device as claimed in claim 1, wherein said silicon included organic film is formed by a polymer of divinyl-siloxane-benzocyclobutene.

4. The semiconductor device of claim 1, further comprising:
   a wiring trench formed through said second silicon included organic film, said silicon non-included organic film and down to and through said first silicon included organic film.

5. A semiconductor device, comprising:
   at least two silicon included organic films composed of a first organic compound including silicon; and
   a silicon non-included organic film which is composed of a second organic compound including substantially no silicon and which is disposed between said silicon included organic films, wherein said silicon non-included organic film has an upper surface and a lower surface facing a substrate, and wherein said silicon included organic film disposed on said upper surface is larger in thickness than said silicon included organic film disposed on said lower surface.

6. A semiconductor device as claimed in claim 5, wherein said first organic compound includes a polymer of a compound having the following structural formula;

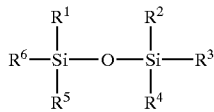

wherein $R^1$ through $R^6$ are hydrocarbon radicals.

7. A semiconductor device as claimed in claim 5, wherein said first organic compound includes a polymer of divinyl-siloxane-benzocyclobutene.

8. A semiconductor device as claimed in claim 5, wherein said first organic compound includes a polymer of siloxane-polyimide.

9. The semiconductor device of claim 5, further comprising:
   a wiring trench formed through said second silicon included organic film, said silicon non-included organic film and down to and through said first silicon included organic film.

10. A semiconductor device, comprising:
    a substrate;
    a first silicon included organic film which is formed on an upper side of said substrate and which is composed of a first organic compound including silicon;
    a silicon non-included organic film which is formed on an upper side of said first silicon included organic film and which is composed of a second organic compound including substantially no silicon;
    a second silicon included organic film which is formed on an upper side of said silicon non-included organic film;
    wherein said second silicon included organic film is larger in thickness than said first silicon included organic film;
    a lower wiring trench formed through said second silicon included organic film, said silicon non-included organic film and down to and through said first silicon included organic film; and
    a conductor formed within said lower wiring trench.

11. The semiconductor device of claim 10, further comprising:
    at least one additional wiring trench disposed on said second silicon included organic film, said silicon non-included organic film and said first silicon included organic film.

12. The semiconductor device of claim 10, further comprising:
    an upper wiring structure disposed over said first silicon included organic film, wherein said upper wiring structure includes a first upper silicon included organic film, an upper silicon non-included organic film, a second upper silicon included organic film and at least one upper wiring trench disposed therein.

13. The semiconductor device of claim 12, wherein said at least one upper wiring trench includes a first upper trench extending through said upper wiring structure in contact with said lower wiring trench and a second upper trench extending through said first upper silicon included organic film and said upper silicon non-included organic film.

14. A semiconductor device, comprising:
    an organic film composed of an organic compound including no silicon;
    a hard mask, wherein said hard mask is for use in etching said organic film composed of the organic compound including no silicon, said hard mask including a first organic compound including silicon; and
    an etching stopper film, wherein said etching stopper film is for use in etching said organic film composed of the organic compound including no silicon, said etching stopper film including a second organic compound including silicon;
    wherein said hard mask is disposed on an upper surface of said organic film composed of an organic compound including no silicon and said etching stopper film is disposed on a lower surface of said organic film, and wherein said hard mask is larger in thickness than said etching stopper film.

15. The semiconductor device of claim 14, further comprising:
    a wiring trench formed through said hard mask, said organic film and down to and through said etching stopper film.

* * * * *

UNITED STATES PATENT AND TRADEMARK OFFICE
CERTIFICATE OF CORRECTION

PATENT NO. : 6,972,453 B2  Page 1 of 1
DATED : December 6, 2005
INVENTOR(S) : Hiroto Ohtake et al.

It is certified that error appears in the above-identified patent and that said Letters Patent is hereby corrected as shown below:

<u>Title page,</u>
Add: -- Item [30], Foreign Application Priority Data
Feb, 22, 2001   (JP) ............ 2001-047358 --.

Signed and Sealed this

Eleventh Day of April, 2006

JON W. DUDAS
*Director of the United States Patent and Trademark Office*